(12) United States Patent
Lee

(10) Patent No.: US 11,862,665 B2
(45) Date of Patent: Jan. 2, 2024

(54) SEMICONDUCTOR STRUCTURE INCLUDING MIM CAPACITOR AND METHOD OF FORMING THE SAME

(71) Applicant: Taiwan Semiconductor Manufacturing Company, Ltd., Hsinchu (TW)

(72) Inventor: I-Che Lee, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 68 days.

(21) Appl. No.: 17/377,416

(22) Filed: Jul. 16, 2021

(65) Prior Publication Data

US 2023/0017938 A1 Jan. 19, 2023

(51) Int. Cl.
| H01L 21/311 | (2006.01) |
| H01L 49/02 | (2006.01) |
| H01L 23/48 | (2006.01) |
| H01L 21/3213 | (2006.01) |

(52) U.S. Cl.
CPC ........ *H01L 28/88* (2013.01); *H01L 21/31144* (2013.01); *H01L 21/32139* (2013.01); *H01L 23/481* (2013.01)

(58) Field of Classification Search
CPC .................... H01L 21/31144; H01L 21/32139
See application file for complete search history.

(56) References Cited

U.S. PATENT DOCUMENTS

| 2019/0206732 A1* | 7/2019 | Chen | H01L 21/76805 |
| 2020/0211981 A1* | 7/2020 | Kothari | H01L 23/564 |
| 2022/0157761 A1* | 5/2022 | Huang | H01L 24/27 |

* cited by examiner

Primary Examiner — Walter H Swanson
(74) Attorney, Agent, or Firm — JCIPRNET

(57) ABSTRACT

A method of forming a semiconductor structure including a metal-insulator-metal (MIM) capacitor includes: forming a stack structure over a substrate, wherein the stack structure includes a plurality of electrode material layers and a plurality of insulating material layers alternately stacked over the substrate; forming a mask layer on the stack structure; and performing a patterning process on the stack structure, so as to form the MIM capacitor comprising alternately stacked electrodes and insulating layers. Performing the patterning process includes: performing a first etching process to remove a first portion of the stack structure exposed by the mask layer; performing a first trimming process on the mask layer to remove a portion of the mask layer, and a first trimmed mask layer is formed; and performing a second etching process to remove a second portion of the stack structure exposed by the first trimmed mask layer.

20 Claims, 30 Drawing Sheets

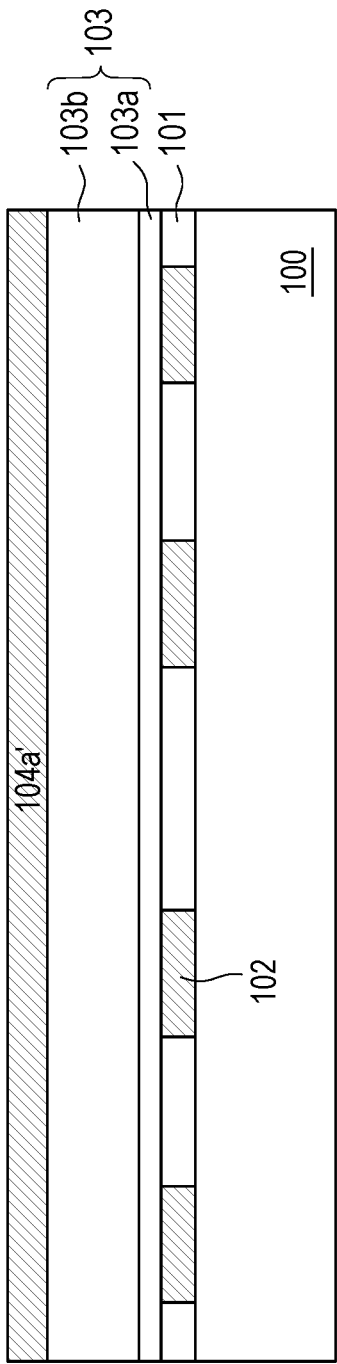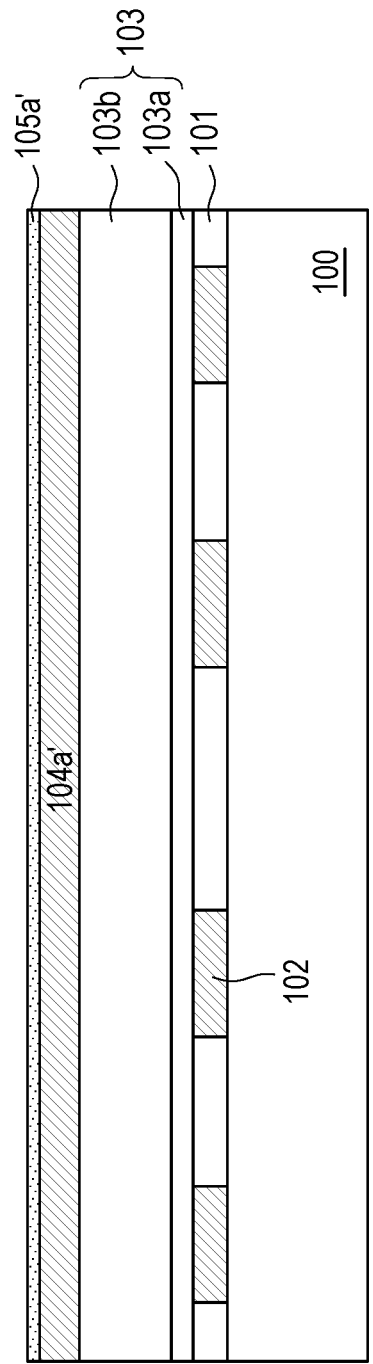

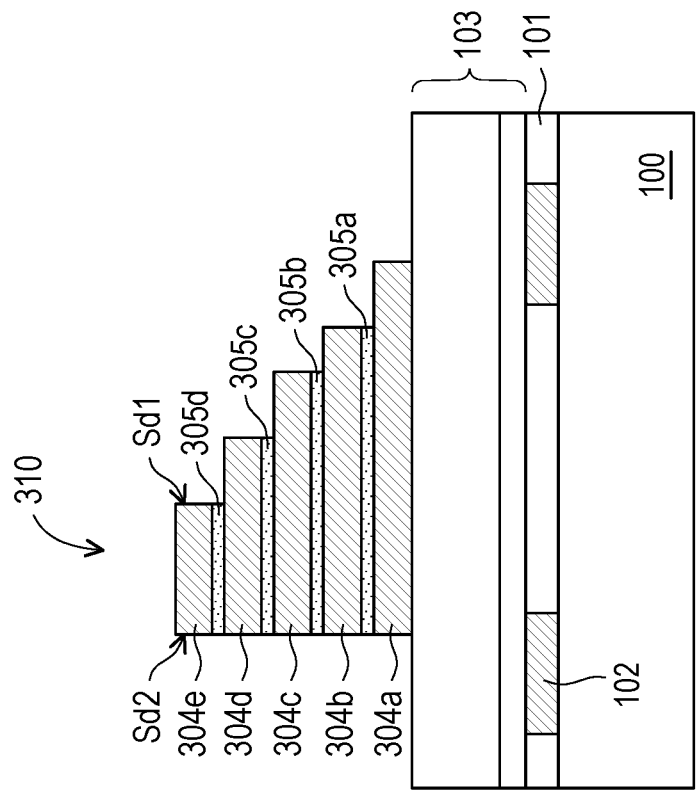
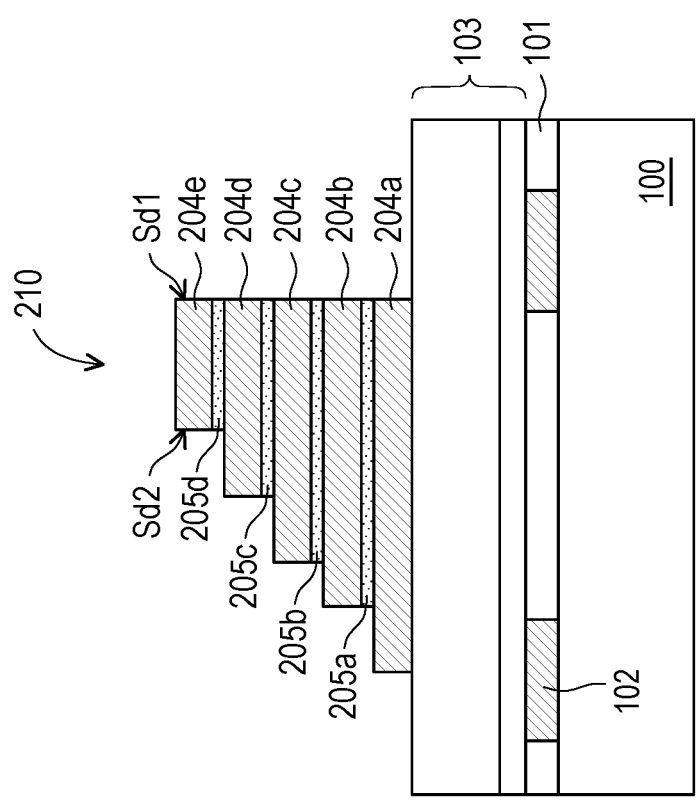
FIG. 3B
FIG. 3A

SEMICONDUCTOR STRUCTURE INCLUDING MIM CAPACITOR AND METHOD OF FORMING THE SAME

BACKGROUND

Modern day integrated chips include various active devices and/or passive devices. Metal-insulator-metal (MIM) capacitors are a common type of passive device that is often integrated into the integrated chips. For example, the capacitor may be used in various radio frequency (RF) circuits (e.g., an oscillator, phase-shift network, filter, converter, etc.), memory devices, and as a decoupling capacitor in high power microprocessor units (MPUs).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A and FIG. 3B are cross-sectional views illustrating semiconductor structures including MIM capacitors according to some other embodiments of the disclosure.

DETAILED DESCRIPTION

Figure 1C:
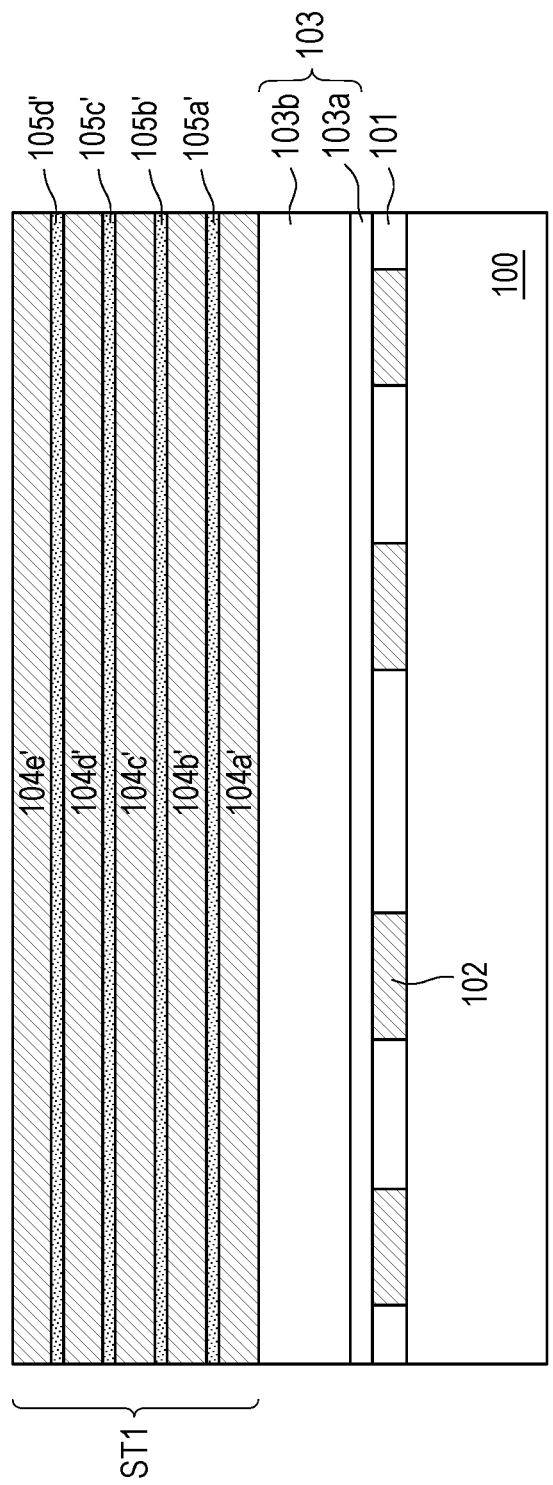
FIG. 1A to FIG. 1R are schematic cross-sectional views illustrating a method of manufacturing a semiconductor structure including a metal-insulator-metal (MIM) capacitor according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the FIG.s. The spatially relative terms are intended to encompass different orientations of the device in use or operation in addition to the orientation depicted in the FIG.s. The apparatus may be otherwise oriented (rotated 90 degrees or at other orientations) and the spatially relative descriptors used herein may likewise be interpreted accordingly.

Various embodiments of the disclosure are directed to provide a MIM capacitor and method of forming the same, which use minimum mask (e.g., photomask) to form the MIM capacitor.

Figure 1D:
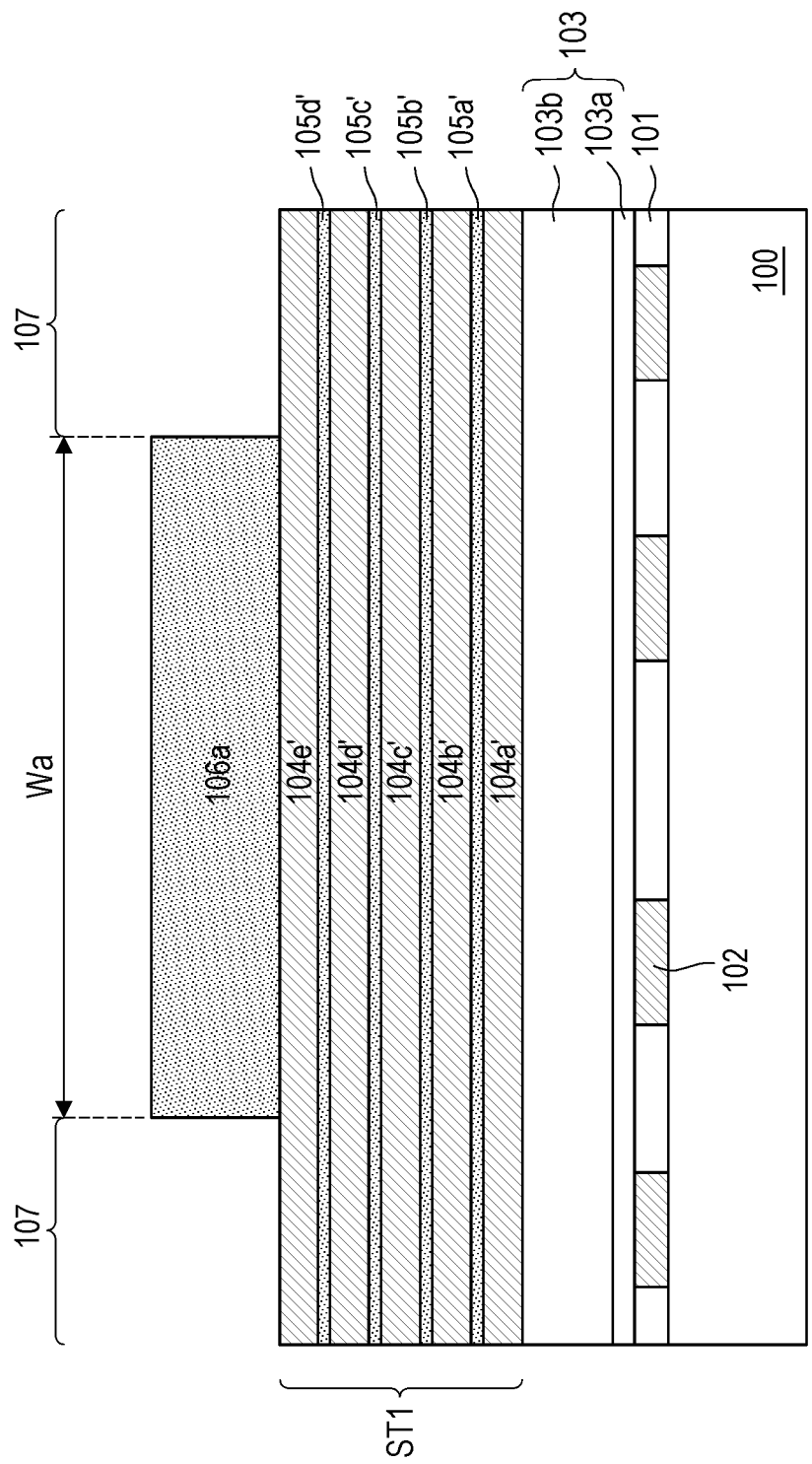
Figure 1E:
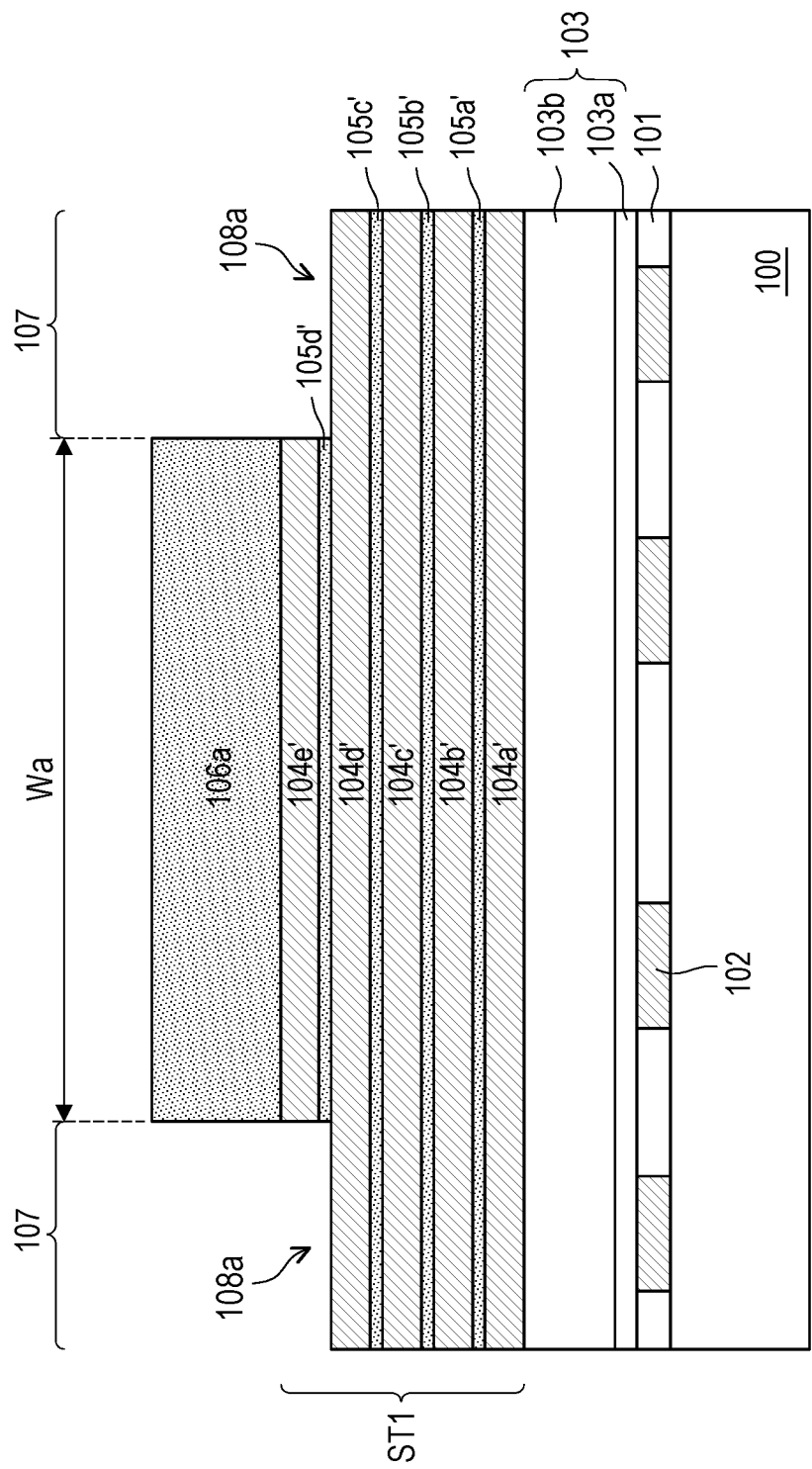
Figure 1F:
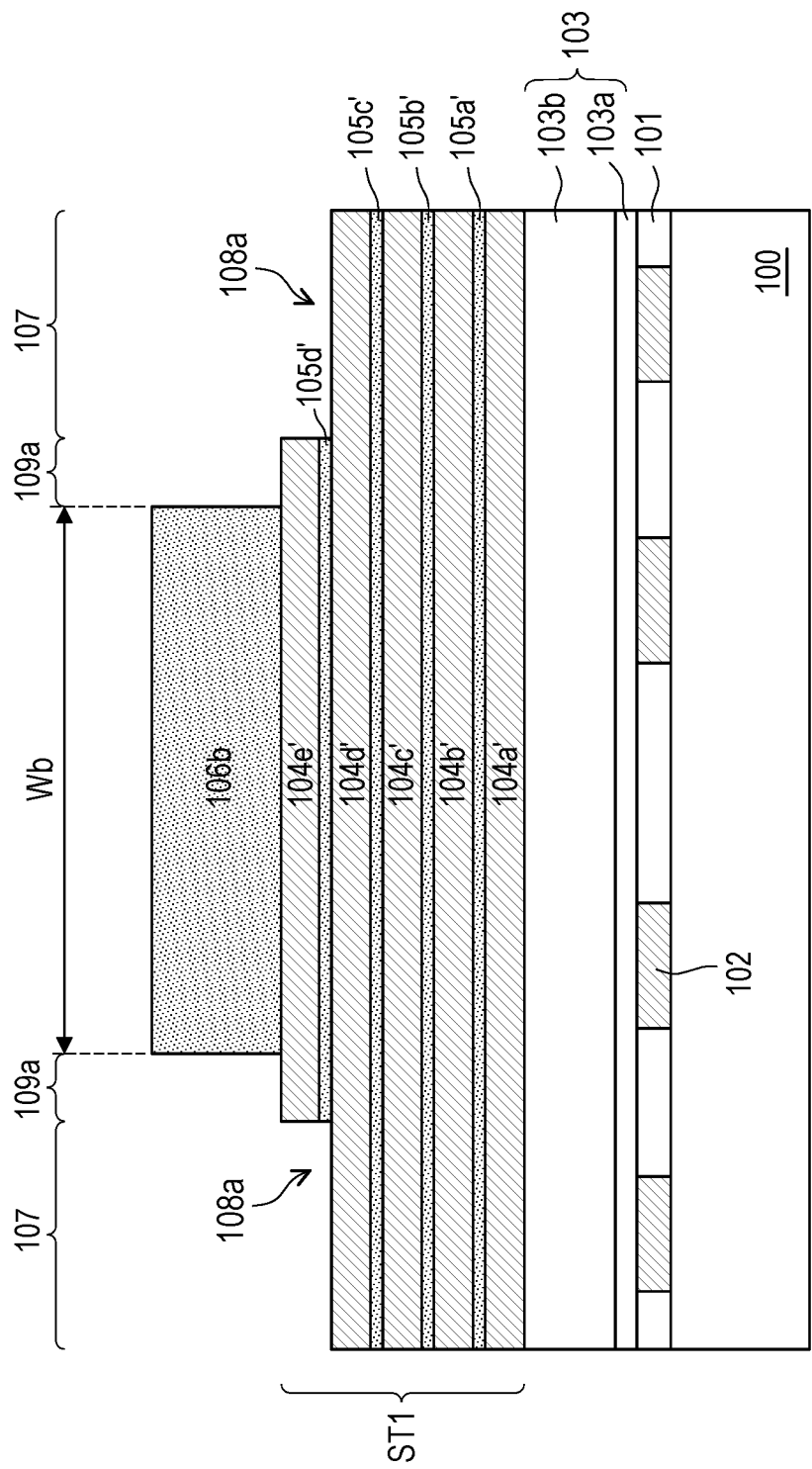
Figure 1G:
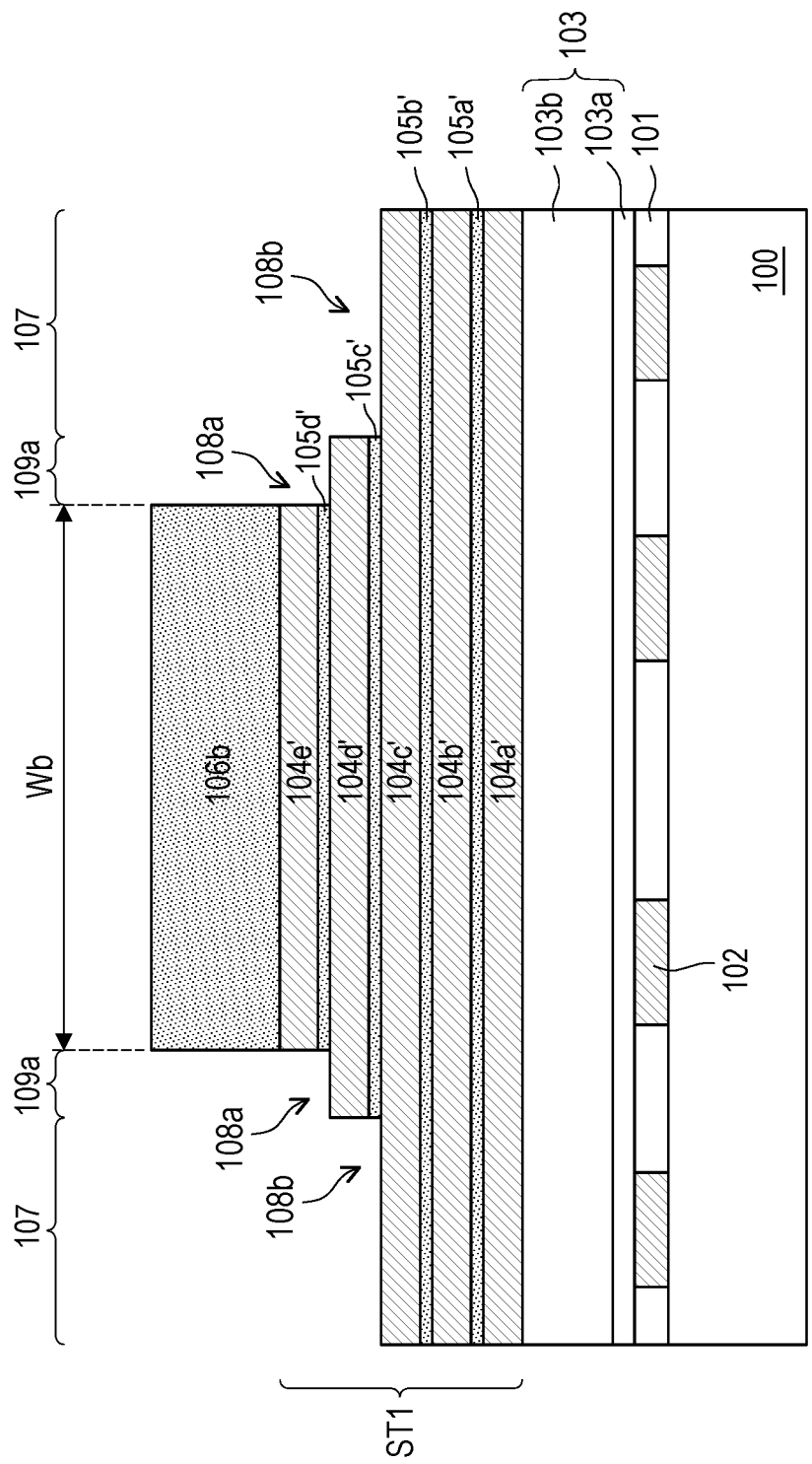
Figure 1H:
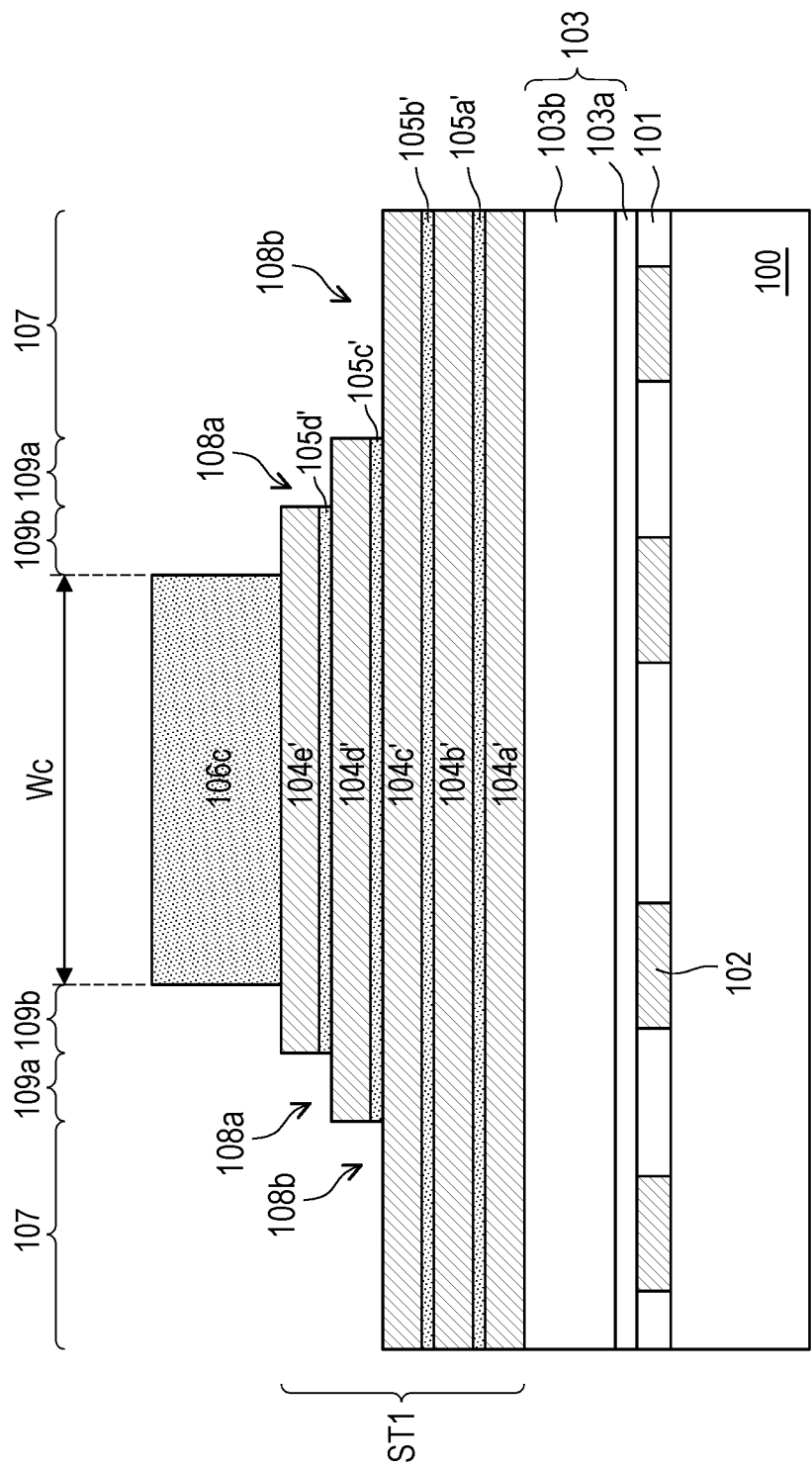
Figure 1I:
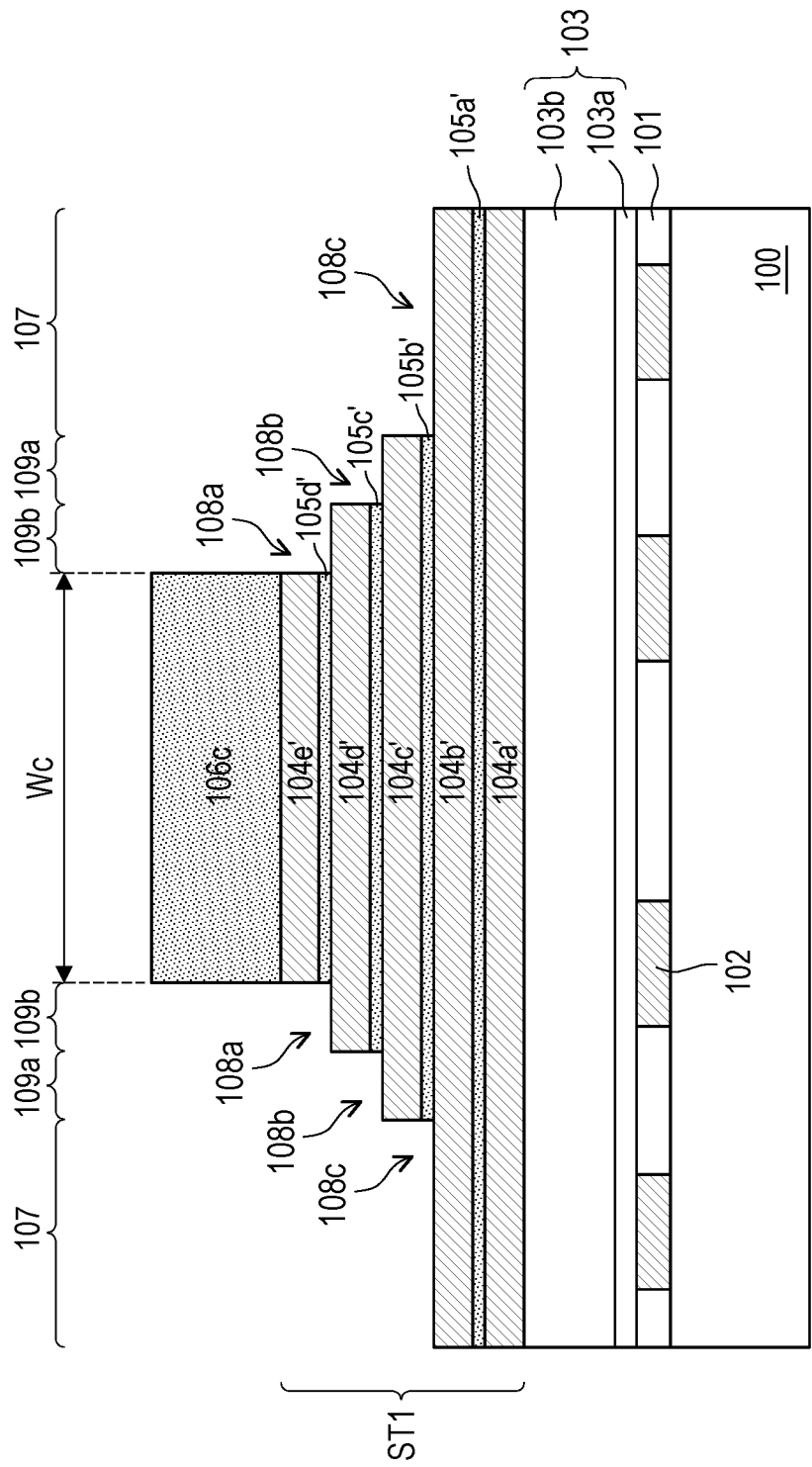
Figure 1J:
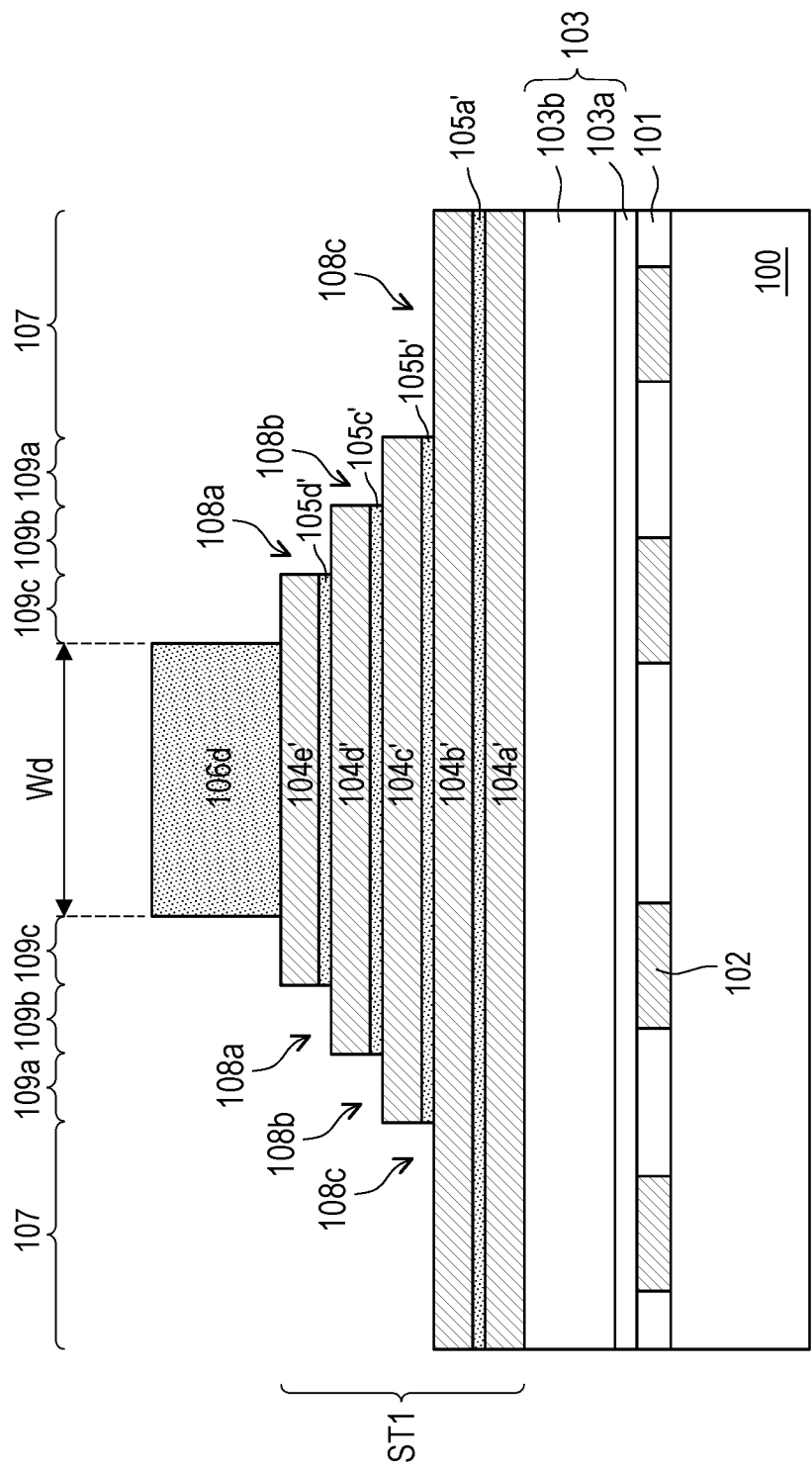
Figure 1K:
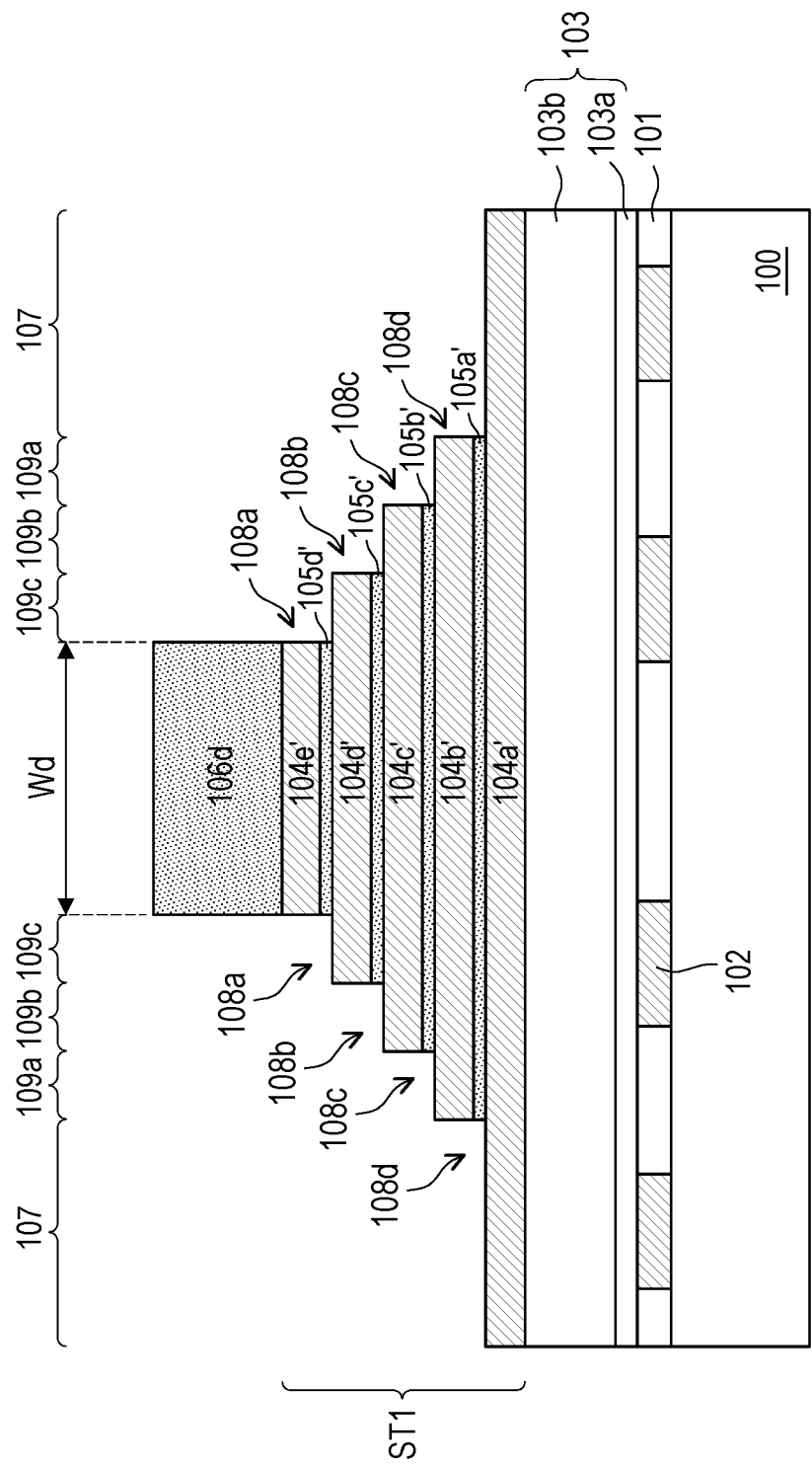
Figure 1L:
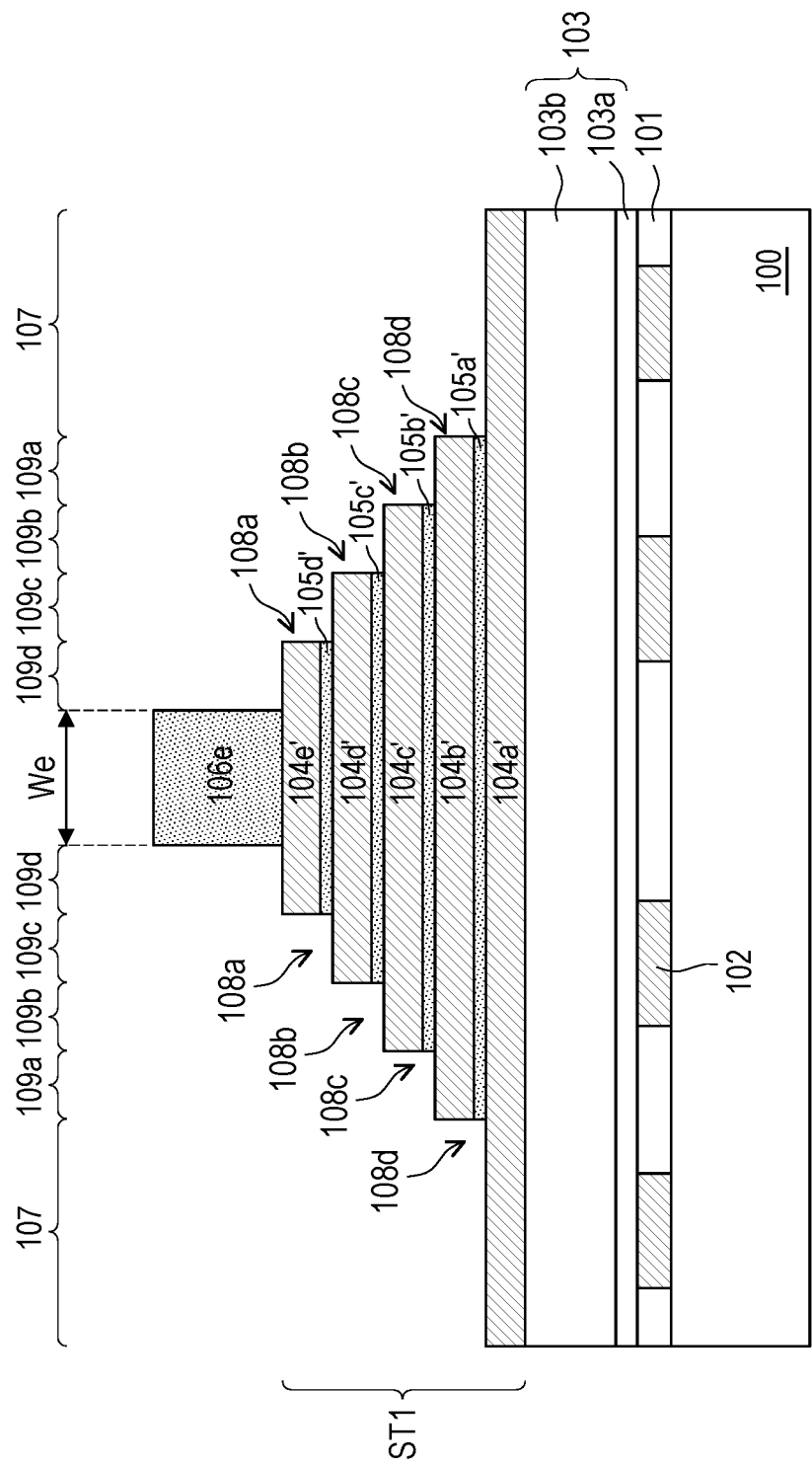
Figure 1M:
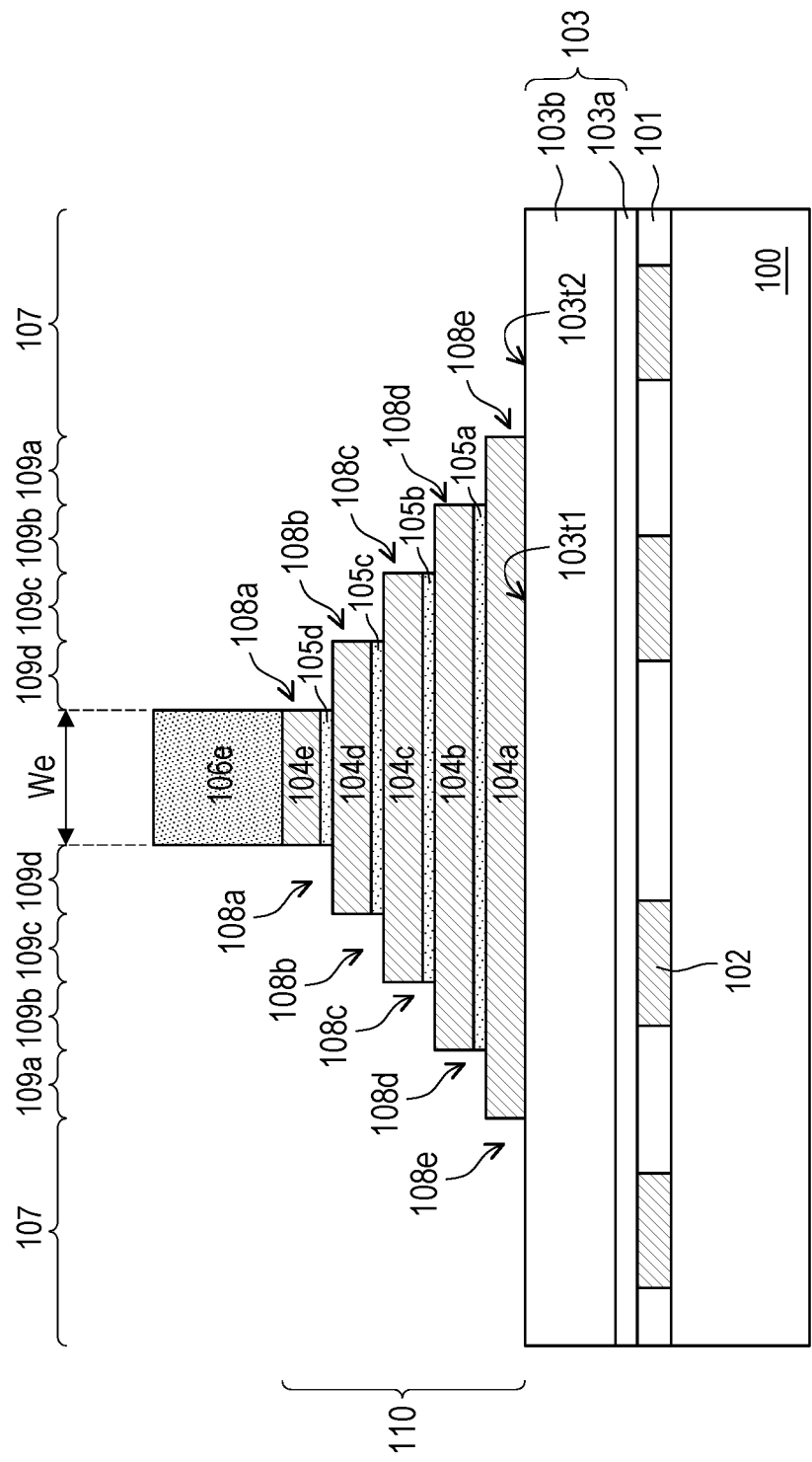
Figure 1N:
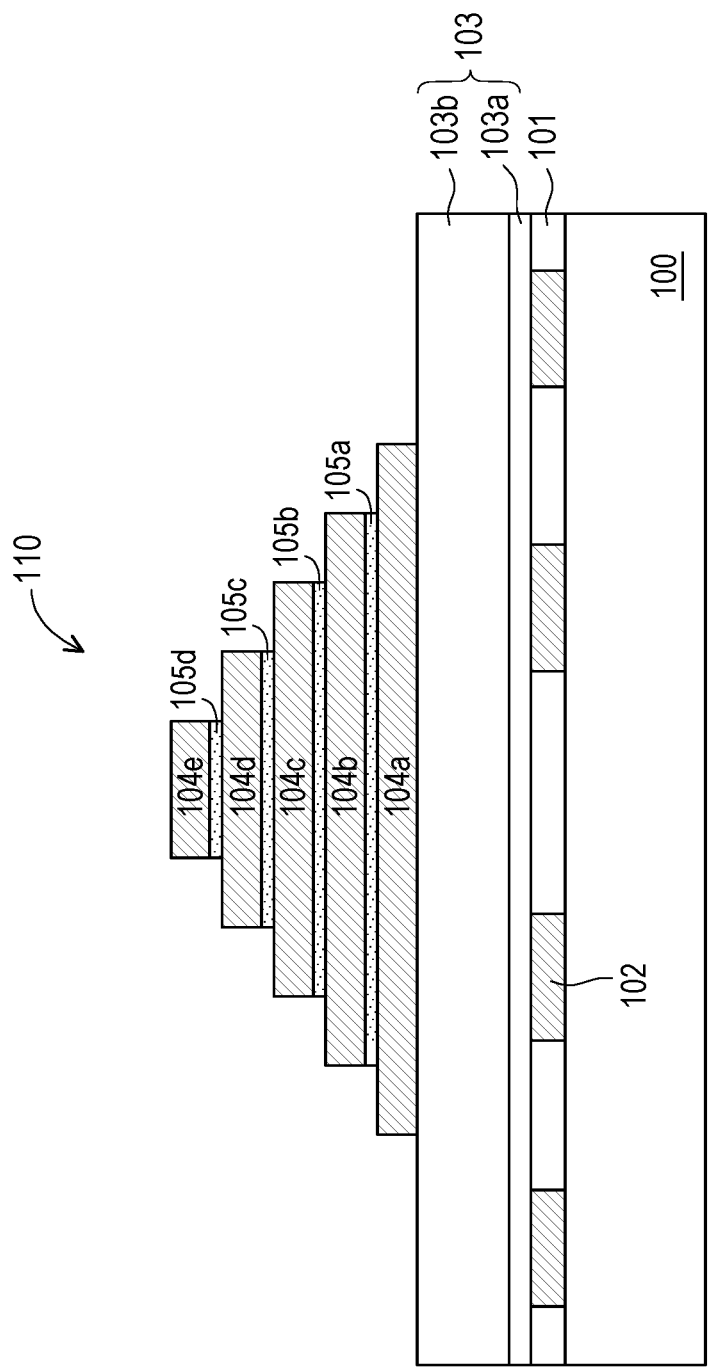
Figure 10:
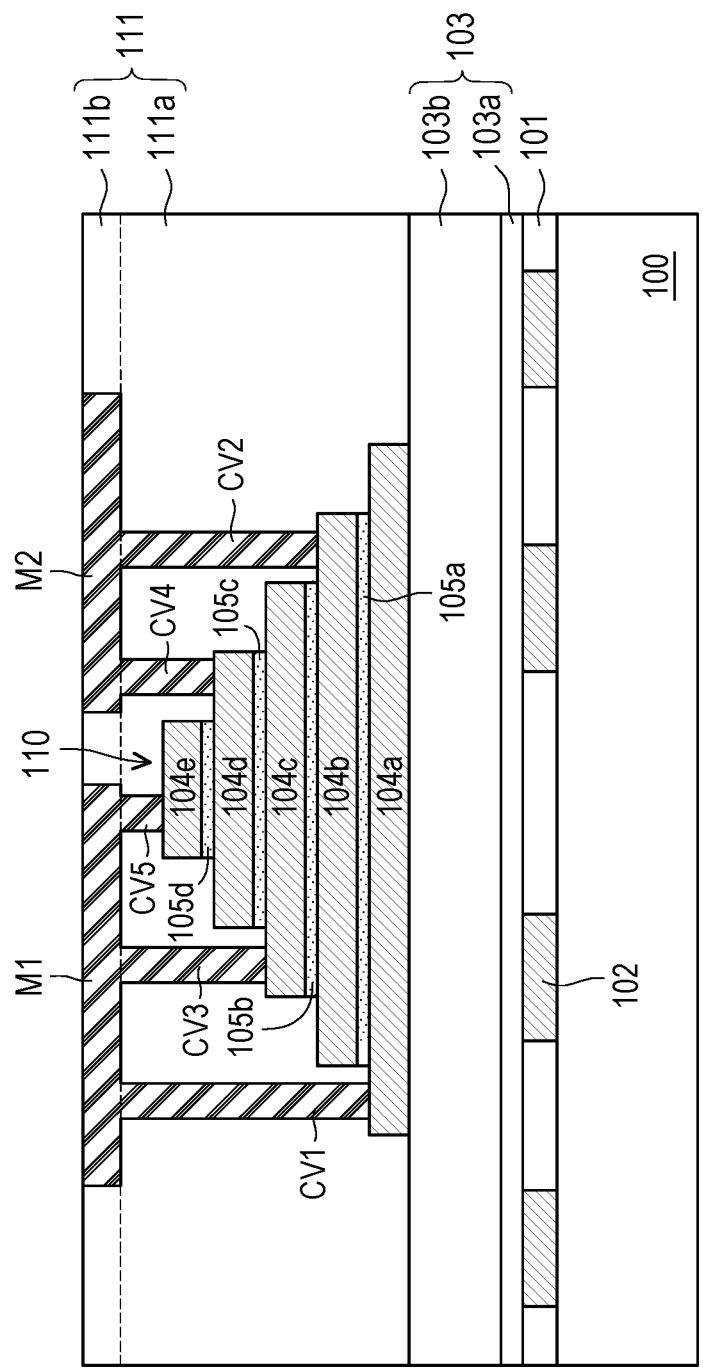
Figure 1P:
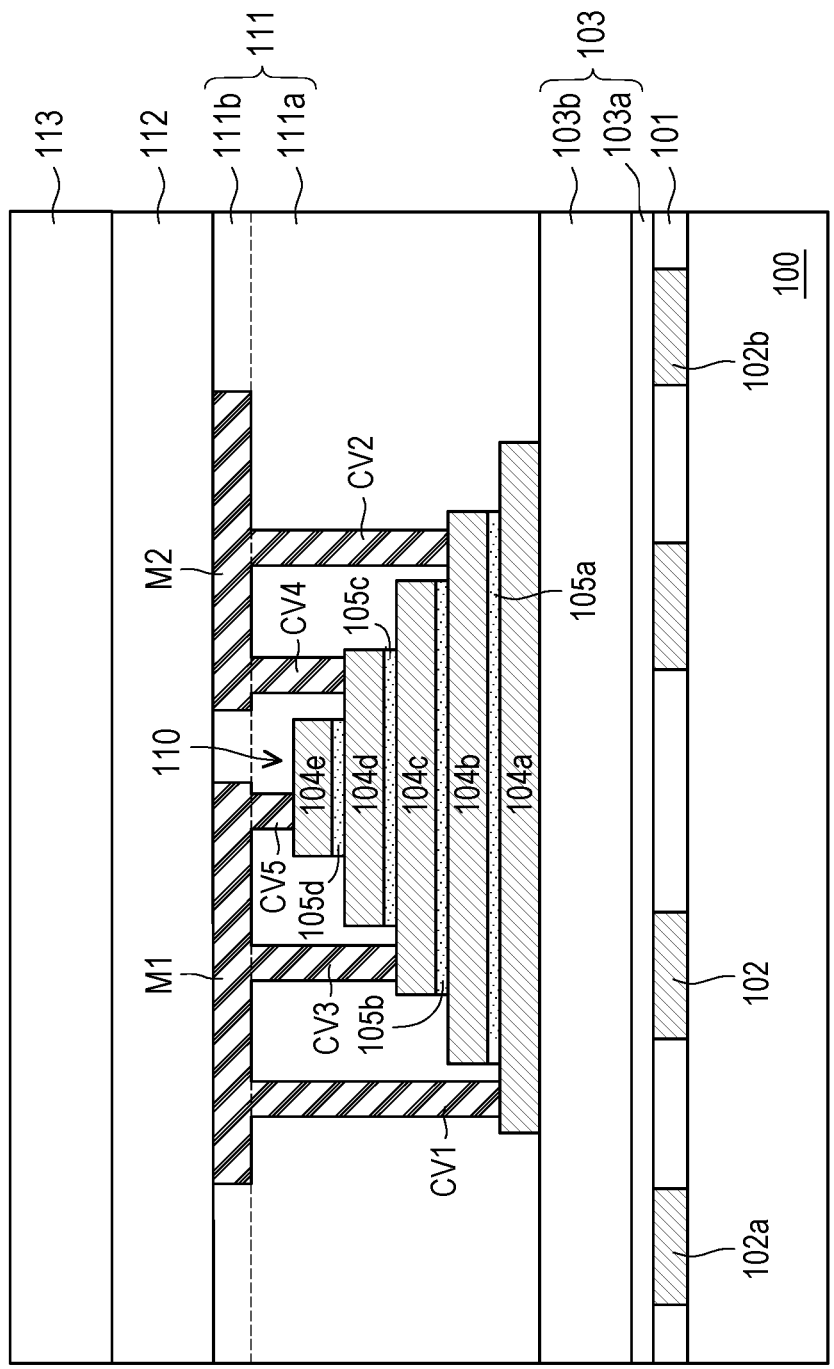
Figure 1Q:
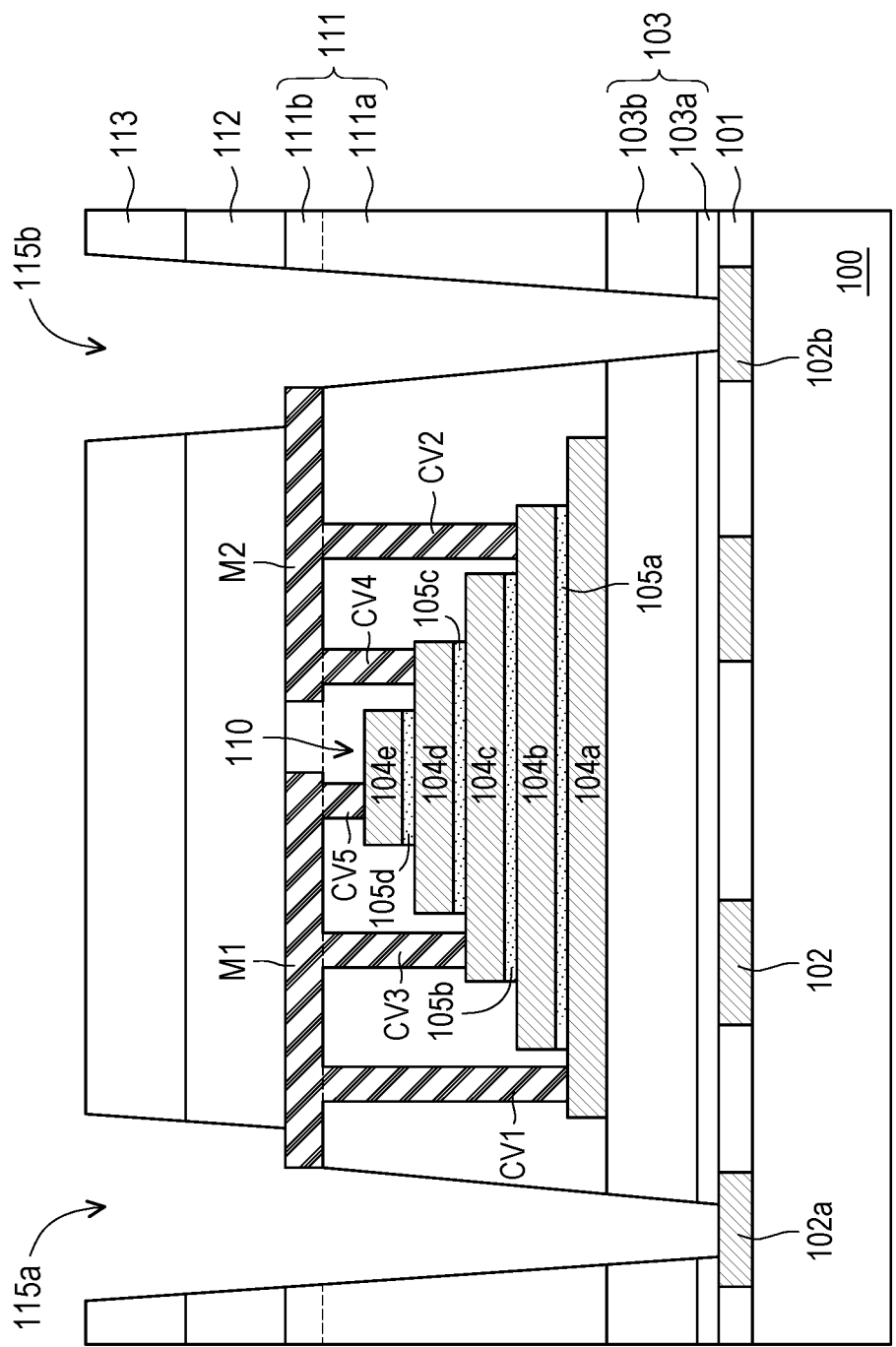
Figure 1R:
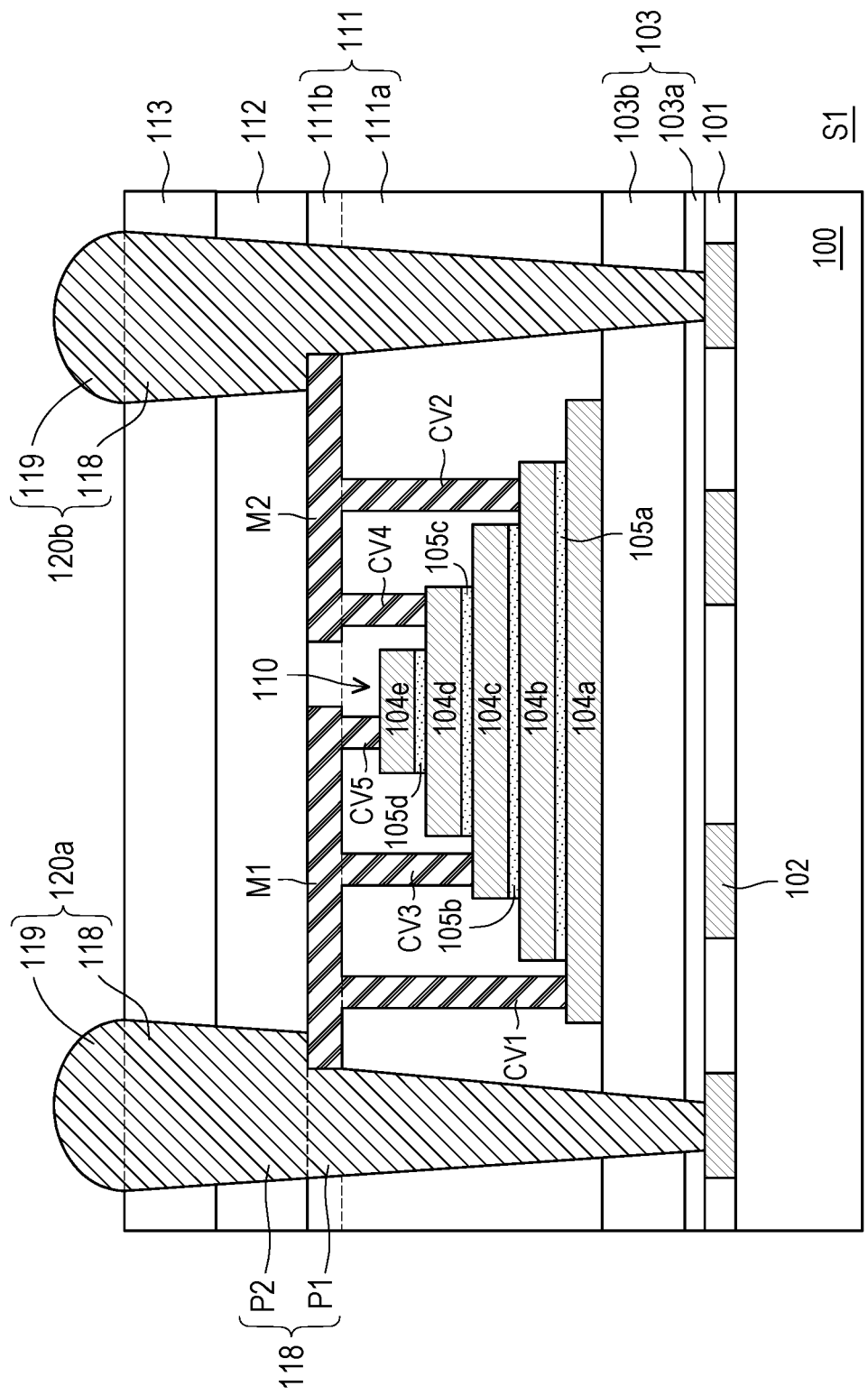

FIG. 1A to FIG. 1R are schematic cross-sectional views illustrating a method of manufacturing a semiconductor structure including a metal-insulator-metal (MIM) capacitor according to some embodiments of the disclosure.

Referring to FIG. 1A, a substrate 100 is provided. In some embodiments, the substrate 100 is a semiconductor substrate such as a silicon substrate. The substrate 100 may be a bulk semiconductor substrate, a semiconductor-on-insulator (SOI) substrate, or the like, which may be doped (e.g., with a p-type and/or an n-type dopant) or undoped. Other substrates, such as a multi-layered or gradient substrate may also be used. In some embodiments, the semiconductor material of the substrate 100 may include silicon; germanium; a compound semiconductor including silicon carbide (SiC), gallium arsenic (GaAs), gallium phosphide (GaP), indium phosphide (InP), indium arsenide (InAs), and/or indium antimonide (InSb); an alloy semiconductor including SiGe, GaAsP, AlInAs, AlGaAs, GaInAs, GaInP, and/or GaInAsP; or combinations thereof.

In some embodiments, a plurality of devices (not shown) are formed in and/or on the substrate 100. The devices may include active devices, passive devices, or combinations thereof. For example, the devices may include transistors, capacitors, resistors, diodes, photodiodes, fuse devices, or the like, or combinations thereof. In some embodiment, transistors may be formed on the substrate 100. The transistors may be or include metal-oxide-semiconductor field-effect transistors (MOSFETs), fin type field-effect transistors (FinFETs), gate-all-around (GAA) transistors, or the like, or combinations thereof.

In some embodiments, an interconnection structure including a dielectric structure and interconnect wirings are formed over the devices (e.g., transistors) on the substrate 100. The interconnection wirings are embedded in the dielectric structure and electrically connected to the devices to form a functional circuit. In some embodiments, the dielectric structure includes inter-layer dielectric layers (ILDs) and inter-metal dielectric layers (IMDs). The interconnect wirings may include multi-layers of conductive lines, conductive vias, and conductive contacts. The conductive contacts may be formed in the ILDs to electrically connect the conductive lines to the devices; the conductive vias may be formed in the IMDs to electrically connect the conductive lines in different tiers. The interconnect wirings may include metal, metal alloy or a combination thereof, such as tungsten (W), copper (Cu), copper alloys, aluminum (Al), aluminum alloys, or combinations thereof.

FIG. 1A schematically illustrates a dielectric layer 101 of the dielectric structure and conductive features 102 of the interconnect wirings of the interconnection structure. The conductive features 102 may be embedded in the dielectric layer 101. In some embodiments, the conductive feature 102 includes a barrier layer and a conductive layer disposed on the barrier layer. The barrier layer may include metal, metal nitride, or a combination thereof, such as titanium, titanium nitride, tantalum nitride, or combinations thereof. The conductive layer may include copper or other suitable metal. In some embodiments, the dielectric layer 101 and the conductive features 102 may be located at any suitable tier of the interconnection structure, such as a tier lower than the topmost tier of the interconnection structure. It is understood that, the interconnection structure may include multiple dielectric layers and conductive features underlying and/or overlying the dielectric layer 101 and the conductive features 102, which are not specifically shown in FIG. 1A, for the sake of brevity.

In some embodiments, a dielectric structure 103 is formed on the dielectric layer 101 and the conductive features 102. The dielectric structure 103 includes suitable dielectric materials, such as silicon oxide, tetraethylorthosilicate (TEOS) silicon oxide, silicon nitride, silicon oxynitride, undoped silicon glass (USG), plasma enhanced oxide (PEOX)-USG, borophosphosilicate glass (BPSG), phosphosilicate glass (PSG), a low-k material having a dielectric constant less than 4 or combinations thereof. The low-k material may include fluorine-doped silicon glass (FSG), hydrogen silsesquioxnane (HSQ), methyl silsesquioxane (MSQ), hybrido-organo siloxane polymer (HOSP); aromatic hydrocarbon such as SiLK, or the like.

The dielectric structure 103 may be a single-layer structure or a multi-layer structure. In some embodiments, the dielectric structure 103 is a multi-layer structure and includes a dielectric layer 103a and a dielectric layer 103b disposed on the dielectric layer 103a. The materials of the dielectric layers 103a and 103b may be the same or different. In an embodiment, the dielectric layer 103a may include SiCN, while the dielectric layer 103b may include SiN. The method of forming the dielectric layers 103a and 103b may include suitable deposition process(es) such as chemical vapor deposition (CVD) process, or spin-coating process.

Still referring to FIG. 1A, a conductive layer 104a' is formed on the dielectric structure 103. The conductive layer 104a' may include various conductive materials, such as a metal, a metal alloy, a metal nitride, a metal silicide, a metal oxide, graphene or combinations thereof. For example, the conductive layer 104a' may include aluminum (Al), titanium (Ti), copper (Cu), tungsten (W), platinum (Pt), palladium (Pd), osmium (Os), ruthenium (Ru), tantalum (Ta), or an alloy thereof, titanium nitride (TiN), tantalum nitride (TaN), tungsten nitride (WN), molybdenum nitride (MoN), TaSiN, TiSiN, WSiN, tungsten silicide, titanium silicide, cobalt silicide, zirconium silicide, platinum silicide, molybdenum silicide, copper silicide, nickel silicide, indium tin oxide (ITO), iridium oxide ($IrO_2$), rhenium oxide ($ReO_2$), rhenium trioxide ($ReO_3$), or combinations thereof. The formation of the conductive layer 104a' may include a suitable technique such as a physical vapor deposition (PVD) process.

Referring to FIG. 1B, an insulating layer 105a' is formed on the conductive layer 104a'. The insulating layer 105a' may include oxide, nitride, oxynitride, a high-k dielectric material or combinations thereof. The insulating layer 105a' includes, for example, silicon oxide, silicon nitride, silicon oxynitride, an oxide-nitride-oxide (ONO) structure, a high-k dielectric material having a dielectric constant greater than that of silicon oxide, or combinations thereof. In some embodiments, the dielectric constant of the high-k dielectric material is greater than 4, greater than 7 or even greater than 10. The high-k dielectric material may include hafnium oxide ($HfO_2$), hafnium silicate ($HfSiO_4$), hafnium silicon oxynitride (HfSiON), aluminum oxide ($Al_2O_3$), yttrium oxide ($Y_2O_3$), lanthanum oxide ($La_2O_3$), lanthanum aluminum oxide (LaAlO), tantalum oxide ($Ta_2O_5$), titanium oxide ($TiO_2$), zirconium oxide ($ZrO_2$), zirconium silicon oxide ($ZrSiO_4$), hafnium zirconium oxide (HfZrO), strontium bismuth tantalite ($SrBi_2Ta_2O_9$, SBT) or combinations thereof.

The insulating layer 105a' may be a single-layer structure or a multi-layer structure. In the embodiments in which the insulating layer 105' is a multi-layer structure, the thicknesses of the respective layers of the multi-layer structure may be the same or different. In some embodiments, the formation of the insulating layer 105a' may include, a CVD process, a spin coating process, an atomic layer deposition (ALD) process or the like.

Referring to FIG. 1C, the formations of the conductive layer and insulating layer are repeated to form a stack structure ST1 including a plurality of conductive layers and a plurality of insulating layers alternatively stacked over the substrate 100. For example, the stack structure may include conductive layers 104a', 104b', 104c', 104d' and 104e' and insulating layers 105a', 105b' 105c' and 105d' alternatively stacked on the dielectric structure 103. The materials and forming methods of the conductive layers 104b', 104c', 104d' and 104e' and insulating layers 105b' 105c' and 105d' are selected from the same candidate materials and forming methods of the conductive layer 104a' and the insulating layer 105a', respectively. The materials of the conductive layer 104a'-104e' may be the same or different, and the materials of the insulating layers 105a'-105d' may be the same or different. In some embodiments, the conductive layers 104a'-104e' may also be referred to as electrode material layers, and the insulating layer 105a'-105d' may also be referred to as insulating material layers.

As shown in FIG. 1C, the insulating layers 105a'-105d' are vertically sandwiched between corresponding adjacent two conductive layers, respectively, such that the conductive layers 104a'-104e' are separated from each other by corresponding insulating layers 105a'-105d'. It is noted that, the numbers of the conductive layers 104a'-104e' and the insulating layers 105a'-105d' shown in the figures are merely for illustration, and the disclosure is not limited thereto.

Referring to FIG. 1D, in some embodiments, a mask layer 106a is formed on the topmost layer (e.g., the conductive layer 105d') of the stack structure ST1. The mask layer 106a may include a photoresist, or the like. In some embodiments, the mask layer 106a may include a patterned photoresist, and may be formed by the following processes. A photoresist layer is formed on the stack structure ST1 by a spin coating process, or a suitable deposition process. Thereafter, a photolithography process including exposure and development processes is performed on the photoresist layer, so as to pattern the photoresist layer. For example, the photoresist layer is exposed to a patterned irradiation (e.g., light) through a photomask (not shown). Thereafter, the development process is performed on the photoresist layer to remove the exposed portion of the photoresist layer when the photoresist layer is a positive photoresist, or remove the masked portion of the photoresist layer when the photoresist layer is a negative photoresist. As a result, the pattern of the photomask is transferred into the photoresist layer.

Still referring to FIG. 1D, in some embodiments, the mask layer 106a is disposed on the topmost layer (e.g., conductive layer 104e') of the stack structure ST1, and portions of the topmost layer are exposed by the mask layer 106a. For example, the mask layer 106a is configured for exposing portions of the conductive layer 104e' in the regions 107, and masking the remaining portions of the stack structure ST1. The regions 107 may also be referred to as openings of the mask layer 106a. In some embodiments, the top view of the mask layer 106a may be square, rectangular, circular, oval, or the like, or other suitable shaped. The mask layer 106a may have a width Wa.

Referring to FIG. 1D and FIG. 1E, in some embodiments, thereafter, etching processes are performed on the stack structure ST1 using the mask layer 106a as an etching mask, such that the pattern of the mask layer 106a is transferred into a portion of the stack structure ST1 (e.g., the top conducive layer 104e' and the top insulating layer 105d'). Portions of the stack structure ST1 exposed by the openings 107 of the mask layer 106a are removed by the etching processes.

In some embodiments, the etching process may be or include any acceptable etch process, such as wet etch or dry etch, reactive ion etch (RIE), neutral beam etch (NBE), the like, or combinations thereof. The etching process may be anisotropic. The etching may remove portions of the conductive layer 104e' and the insulating layer 105d' exposed in the regions 107 and define recesses 108 in the conductive layer 104e' and the insulating layer 105d'. The area of the recesses 108 corresponds to that of the regions 107. In some embodiments, different etchants are used to etch the conductive layer 104e' and the insulating layer 105d'. For example, a first sub-etching process is performed to remove portions of the conductive layer 104e' exposed by the openings 107 of the mask layer 106a. During the first sub-etching process, the insulating layer 105d' may serve as an etching stop layer. Thereafter, a second sub-etching process is performed to remove portions of the insulating layer 105d' exposed by the mask layer 106a and the conductive layer 104e'. During the second sub-etching process, the underlying conductive layer 104d' may serve as an etching stop layer. As a result, the portions of the conductive layer 104e' and the insulating layer 105d' may be selectively removed without removing remaining layers of the stack structure ST1, and recesses 108a may be formed to extend through the conductive layer 104e' and the insulating layer 105d', and expose portions of the conductive layer 104d'. In some embodiments, after the etching process is performed, the footprint of the conductive layer 104e'/insulating layer 105d' is substantially the same as the footprint of the mask layer 106a.

Referring to FIG. 1E and FIG. 1F, in some embodiments, a trimming process is then performed on the mask layer 106a to reduce the size (e.g., width) of the mask layer 106a, and a mask layer 106b is formed. The mask layer 106b may also be referend to as a first trimmed mask layer 106b. The trimming process may include an etching process, such as a dry etching process. For example, a suitable amount of etching gas is applied to the mask layer 106a to remove a portion of the mask layer 106a. In some embodiments, no photomask is used for the trimming process of the mask layer 106b. In some embodiments, both the width and thickness of the mask layer 106 may be reduced by the trimming process. For example, the mask layer 106b has a width Wb that is less than the width Wa of the mask layer 106a. Accordingly, the size (e.g., width) of the regions that expose the stack structure ST1 is increased. For example, the trimming of the mask layer 106b create a trimmed regions 109a that further expose a portion of the top conductive layer 104e' of the stack structure ST1. Herein, the term "trimmed region" refers to the region previously occupied by the portion of mask layer that has been trimmed. In some embodiments, the present trimming process may also be referred to as a first trimming process, and the trimmed region 109a may also be referred to as a first trimmed region.

Referring to FIG. 1F, after the trimming process is performed, portions of the top surface of the conductive layer 104e' are exposed by the trimmed region 109a of mask layer 106b, and portions of the top surface of the conductive layer 104d' are exposed by the mask layer 106b and the recess 108a of the overlying conductive layer 104e' and insulating layer 105d'.

Referring to FIG. 1F and FIG. 1G, etching processes are performed to remove portions of the stack structure ST1 exposed by the mask layer 106b. In some embodiments, the etching processes are similar to those described in FIG. 1D to FIG. 1E. For example, the etching processes may remove portions of the conductive layer 104e' and the insulating layer 105d' exposed by the trimmed region 109a of the mask layer 106b, and remove portions of the conductive layer 104d' and the insulating layer 105c' exposed by the mask layer 106b, the conductive layer 104e' and the insulating layer 105d' (i.e., portions of the conductive layer 104d' and the insulating layer 105c' exposed by the recess 108a). The etching of the conductive layer 104e' and the insulating layer 105d' uses the mask layer 106b as an etching mask, and etching of the conductive layer 104d' and the insulating layer 105c' uses the mask layer 106b, the conductive layer 104e' and the insulating layer 105d' as an etching mask.

In some embodiments, the etching process includes a first sub-etching process for removing the exposed conductive layer 104e' and 104d', and a second sub-etching process for partially removing the insulating layers 105d' and 105c'. During the first sub-etching process, the insulating layers 105d' and 105c' may serve as etch stop layers and portions of the insulating layers 105d' and 105c' are exposed after the conductive layer 104e' and 104d' are removed. During the second sub-etching process, the exposed portions of the insulating layers 105d' and 105c' are removed, and the conductive layer 104d' and 104c' serve as etch stop layers. During the etching process, since the underlying layers of the stack structure are covered by the insulating layer 105c' and the conductive layer 104d', the underlying layers are not etched.

Referring to FIG. 1G, through the etching process, the pattern of the mask layer 106b is transferred into the conductive layer 104e' and the insulating layer 105d', while the previous pattern of the conductive layer 104e' and the insulating layer 105d' shown in FIG. 1F is transferred into the conductive layer 104d' and the insulating layer 105c'. After the etch process is performed, the conductive layer 104e' and the insulating layer 105d' have footprints substantially the same that of the mask layer 106b. For example, the widths of the conductive layer 104e' and the insulating layer 105d' may be substantially equal to the width Wb of the mask layer 106b. The recess 108a in the conductive layer 104e' and the insulating layer 105d' are widened, and may correspond to (e.g., have the same size as) the region 107 and the trimmed region 109a. The recess 108a expose portions of the top surface of the conductive layer 104d'.

Still referring to FIG. 1G, the recess is further extended downward into the stack structure ST1. For example, a recess 108b is formed in and extended through the conductive layer 104d' and the insulating layer 105c', and portions of the top surface of the conductive layer 104c' are exposed by the recess 108b. The recess 108b is in spatial communication with the recess 108a, and may correspond to (e.g., have the same size as) the region 107. In other words, the recess in the stack structure ST1 is widened and deepened. In some embodiments, the conducive layer 104d' and the insulating layer 105c' have sizes (e.g., width) substantially equal to the size (e.g., width Wa) of the mask layer 106a (FIG. 1E).

Thereafter, the trimming process of the mask layer and the etching processes for removing the conductive layers and insulating layers may be repeated to pattern the stack structure ST1. During the etching processes, the etching of the topmost conductive layer and insulating layer uses the trimmed mask layer as the etching mask, and the etching of the conductive layer and insulating layer at lower tier use the trimmed mask layer and overlying conductive layer and insulating layer as the etching mask.

For example, referring to FIG. 1G to FIG. 1H, a trimming process is then performed on the mask layer 106b to remove portions of the mask layer 106b, so as to form a mask layer 106c and generate a trimmed region 109b. The trimming process may also be referred to as a second trimming process, and the trimmed region 109b may also be referred to as a second trimmed region. The method of performing second trimming process is substantially the same as that of the first trimming process, which is not described again here.

Referring to FIG. 1H, after the second trimming process, the size (e.g., width) of the mask layer 106c is decreased. The mask layer 106c has a width Wc less than the width Wb of the mask layer 106b (FIG. 1G). As such, portions of the top surface of the conductive layer 104e' are further exposed by the trimmed region 109b.

Referring to FIG. 1H and FIG. 1I, etching processes are performed to remove portions of the stack structure ST1 exposed by the mask layer 106c. For example, the etching processes may remove portions of the conductive layer 104e' and the insulating layer 105d' exposed by the trimmed region 109b of the mask layer 106b, portions of the conductive layer 104d' and the insulating layer 105c' exposed by the mask layer 106b, and the overlying conductive layer 104e' and the insulating layer 105d' (i.e., portions of the conductive layer 104d' and the insulating layer 105c' exposed by the recess 108a and the trimmed region 109a), and portions of the conductive layer 104c' and 105b' exposed by the mask layer 106c and the overlying conductive layers and insulating layers (e.g., portions of the conductive layer 104c' and the insulating layer 105b' exposed by the recess 108b and the region 107). The etching of the conductive layer 104e' and the insulating layer 105d' uses the trimmed mask layer 106c as the etching mask; the etching of the conductive layer 104d' and the insulating layer 105c' uses the trimmed mask layer 106c, the conductive layer 104e' and the insulating layer 105d' as the etching mask, while the etching of the conductive layer 104c' and the insulating layer 105b' uses the trimmed mask layer 106c, the conductive layers 104e', 104d' and the insulating layers 105d', 105c' as the etching mask. As such, the pattern of the mask layer 106c is transferred into the conductive layer 104e' and the insulating layer 105d'; the previous pattern of the conductive layer 104e' and the insulating layer 105d' shown in FIG. 1H is transferred into the conductive layer 104d' and the insulating layer 105c'; and the previous pattern of the conductive layer 104d' and the insulating layer 105c' shown in FIG. 1H is transferred into the conductive layer 104c' and the insulating layer 105b'.

The etching process includes a first sub-etching process during which the exposed conductive layer 104e', 104d' and 104c' are removed, with the insulating layers 105d', 105c' and 105b' serving as etch stop layers, and after the first sub-etching process, portions of the insulating layers 105d', 105c' and 105b' previously covered by the removed conductive layer 104e', 104d' and 104c' are exposed. The etching process further includes a second sub-etching process during which the exposed portions of the insulating layers 105d', 105c' and 105b' are removed, with the conductive layers 104d', 104c' and 104b' serving as etch stop layers, and after the second sub-etching process, portions of the conductive layers 104d', 104c', 104b' previously covered by the removed insulating layers are exposed. During the etching process, since the underlying layers of the stack structure are covered by the insulating layer 105b' and the conductive layer 104c', the underlying layers are not etched.

Still referring to FIG. 1I, after the etching process, the recess of the stack structure ST1 is further widened and deepened. For example, the recesses 108a in the conductive layer 104e' and the insulating layer 105d' are widened and correspond to the trimmed regions 109b, 109a and the region 107. The recess 108b in the conductive layer 104' and the insulating layer 105c' are widened and correspond to the trimmed region 109a and the region 107. A recess 108c is formed in and penetrating through the conductive layer 104c' and the insulating layer 105b'. The recess 108c corresponds to the region 107, and expose portions of the top surface of the conductive layer 104b'.

Referring to FIG. 1I and FIG. 1J, in some embodiments, a trimming process is then performed on the mask layer 106c to remove portions of the mask layer 106c, so as to form a mask layer 106d and generate a trimmed region 109c. The trimming process may also be referred to as a third trimming process, and the trimmed region 109c may also be referred to as a third trimmed region. The method of performing third trimming process is substantially the same as that of the foregoing trimming process, which is not described again here.

Referring to FIG. 1J, after the second trimming process, the size (e.g., width) of the mask layer 106d is decreased. The mask layer 106d has a width Wd less than the width Wc of the mask layer 106c (FIG. 1I). As such, portions of the top surface of the conductive layer 104e' are further exposed by the trimmed region 109c.

Referring to FIG. 1J and FIG. 1K, etching processes are performed to remove portions of the stack structure ST1 exposed by the mask layer 106b. For example, the etching processes may remove portions of the conductive layer 104e' and the insulating layer 105d' exposed by the trimmed region 109c of the mask layer 106b, portions of the conductive layer 104d' and the insulating layer 105c' exposed by the mask layer 106b, the conductive layer 104e' and the insulating layer 105d' (i.e., portions of the conductive layer 104d' and the insulating layer 105c' exposed by the recess 108a and the trimmed region 109b), portions of the conductive layer 104c' and the insulating layer 105b' exposed by the mask layer 106c and the overlying conductive layers and insulating layers (e.g., portions of the conductive layer 104c' and 105b' exposed by the recess 108b and the trimmed region 109a), and portions of the conductive layer 104b' and the insulating layer 105a' exposed by the recess 108c and the region 107.

Similar to the above-described etching processes, the etching of the top conducive layer 104e' and the insulating layer 105d' uses the mask layer 106d as the etching mask, while the etching of the conductive layer and insulating layer at lower tier uses the mask layer 106d and overlying conductive layer(s) and insulating layer(s) as the etching mask. For example, the etching of the conductive layer 104b' and the insulating layer 105a' uses the mask layer 106d and the overlying conductive layers 104e, 104d', 104c' and insulating layers 105d', 105c', 105b' as the etching mask. As such, the pattern of the mask layer 106d is transferred into the conductive layer 104e' and the insulating layer 105d'; the previous pattern of the conductive layer 104e' and the insulating layer 105d' shown in FIG. 1J is transferred into the conductive layer 104d' and the insulating layer 105c'; the previous pattern of the conductive layer 104d' and the insulating layer 105c' shown in FIG. 1J is transferred into the conductive layer 104c' and the insulating layer 105b'; and the previous pattern of the conductive layer 104c' and the insulating layer 105b' shown in FIG. 1J is transferred into the conductive layer 104b' and the insulating layer 105a'.

In some embodiments, the etching process includes a first sub-etching process for removing the conductive layers and a second sub-etching process for removing the insulating layers. For example, during the first sub-etching process, portions of the conductive layers 104e, 104d', 104c' and 104b' exposed by the mask layer 106d are removed, with the insulating layers 105d', 105c', 105b and 105a' serve as etching stop layers. After the first sub-etching process, portions of the insulating layers 105d', 105c', 105b and 105a' are exposed. During the second sub-etching process, the exposed portions of the insulating layers 105d', 105c', 105b and 105a' are removed, with the conductive layers 104d', 104c', 104b' and 104a' serving as etching stop layers.

Referring to FIG. 1K, the recesses 108a, 108b, 108c are widened. The recess 108a corresponds to the trimmed regions 109a-109c and the region 107. The recess 108b corresponds to the trimmed regions 109a-109b and the region 107. The recess 108c corresponds to the trimmed region 109a and the region 107. A recess 108d is further formed in and penetrating through the conductive layer 104b' and the insulating layer 105a', and portions of the top surface of the conductive layer 104a' are exposed.

Referring to FIG. 1K and FIG. 1L, a trimming process is then performed on the mask layer 106d to remove portions of the mask layer 106d, so as to form a mask layer 106e and generate a trimmed region 109d. The trimming process may also be referred to as a fourth trimming process, and the trimmed region 109d may also be referred to as a fourth trimmed region. The method of performing the fourth trimming process is substantially the same as that of the foregoing trimming process, which is not described again here.

Referring to FIG. 1L, after the second trimming process, the size (e.g., width) of the mask layer 106e is decreased. The mask layer 106e has a width We less than the width Wd of the mask layer 106d (FIG. 1K). As such, portions of the top surface of the conductive layer 104e' are further exposed by the trimmed region 109d.

Referring to FIG. 1L and FIG. 1M, thereafter, etching processes are performed to remove portions of the stack structure ST1 exposed by the mask layer 106e. For example, the etching processes may remove portions of the conductive layer 104e' and the insulating layer 105d' exposed by the trimmed region 109d of the mask layer 106e, portions of the conductive layer 104d' and the insulating layer 105c' exposed by the mask layer 106e, the conductive layer 104e' and the insulating layer 105d' (i.e., portions of the conductive layer 104d' and the insulating layer 105c' exposed by the recess 108a and the trimmed region 109c), portions of the conductive layer 104c' and the insulating layer 105b' exposed by the mask layer 106e and the overlying conductive layers and insulating layers (e.g., portions of the conductive layer 104c' and the insulating layer 105b' exposed by the recess 108b and the trimmed region 109b), portions of the conductive layer 104b' and the insulating layer 105a' exposed by the mask layer 106e and the overlying conductive layers and insulating layers (e.g., portions of the conductive layer 104b' and the insulating layer 105a' exposed by the recess 108c and the trimmed region 109a, and portions of the conductive layer 104a' exposed by the mask layer 106e and the overlying conductive layers and insulating layers (e.g., portions of the conducive layer 104a' exposed in the region 107).

The etching of the conductive layer 104a' uses the mask layer 106e and the overlying conductive layers 104e', 104d', 104c', 104b' and insulating layers 105d', 105c', 105b', 105a' as the etching mask. Through the etching process, the pattern of the mask layer 106e is transferred into the conductive layer 104e' and the insulating layer 105d'; the previous pattern of the conductive layer 104e' and the insulating layer 105d' shown in FIG. 1L is transferred into the conductive layer 104d' and the insulating layer 105c'; the previous pattern of the conductive layer 104d' and the insulating layer 105c' shown in FIG. 1L is transferred into the conductive layer 104c' and the insulating layer 105b'; the previous pattern of the conductive layer 104c' and the insulating layer 105b' shown in FIG. 1L is transferred into the conductive layer 104b' and the insulating layer 105a'; and the previous pattern of the conductive layer 104b' and the insulating layer 105a' shown in FIG. 1L is transferred into the conductive layer 104a'.

In some embodiments, the etching process includes a first sub-etching process for removing the conductive layers and a second sub-etching process for removing the insulating layers. For example, during the first sub-etching process, portions of the conductive layers 104e, 104d', 104c', 104b' and 104a' exposed by the mask layer 106e are removed, with the insulating layers 105d', 105c', 105b, 105a' and the dielectric structure 103 serving as etching stop layers. During the second sub-etching process, portions of the insulating layers 105d', 105c', 105b and 105a' are removed, with the conductive layers 104d', 104c', 104b' and 104a' serving as etching stop layers. After the etching process is performed, conductive layers 104a-104e and insulating layers 105a-105d are formed to constitute a capacitor 110. The capacitor 110 may also be referred to as MIM capacitor, and the conductive layers 104a-104e serve as electrodes of the capacitor 110, while the insulating layers 105a-105d serve as insulators of the capacitor 110.

In some embodiments, the dielectric structure 103 includes a material different from the insulating layers 105a'-105d', during the second sub-etching process, the dielectric structure 103 may also serve as an etching stop layer and may be substantially not removed. However, the disclosure is not limited thereto. In some other embodiments, the dielectric structure 103 may be slightly removed.

Referring to FIG. 1M, the recesses 108a-108d are widened, and a recess 108e is formed in and penetrating through the conductive layer 104a. Portions of the top surface of the dielectric structure 103 are exposed by the recess 108e. In some embodiments, the top surface of the dielectric structure 103 includes a first top surface portion 103t1 covered by the conductive layer 104a and a second top surface portion 103t2 exposed by the conductive layer 104a. The first top surface portion 103t1 may be substantially coplanar with the second top surface portion 103t2, but the disclosure is not limited thereto. In some other embodiments in which the dielectric structure 103 is partially removed during the etching process of the stack structure ST1, the second top surface portion 103t2 may be lower than the first top surface portion 103t1.

Referring to FIG. 1M and FIG. 1N, the mask layer 106e is removed by, for example, a stripping process or an ashing process. In some embodiments, the capacitor 110 includes the electrodes 104a-104e and insulating layers 105a-105d alternately stacked over the substrate 100. It is noted that, the numbers of the electrodes and insulating layers included in the capacitor 110 are merely for illustration, and the disclosure is not limited thereto.

Referring to FIG. 1N, the capacitor 110 has a stepped structure or a ladder structure, in which the electrodes at a lower level height laterally protrudes from sidewalls of the electrodes at higher level height. In some embodiments, the insulating layer 105a is vertically sandwiched between and physically contact the electrodes 104a and 104b, the sidewalls of the insulating layer 105a may be substantially aligned with sidewalls of the overlying electrodes 104b, and the sidewalls of the electrode 104a laterally extends beyond sidewalls of the insulating layer 105a and the electrode 104b. The insulating layer 105b is vertically sandwiched between and physically contact the electrodes 104b and 104c, the sidewalls of the insulating layer 105b may be substantially aligned with sidewalls of the overlying electrodes 104c, and the sidewalls of the electrode 104b laterally extend beyond sidewalls of the insulating layer 105b and the electrode 104c. The insulating layer 105c is vertically sandwiched between and physically contact the electrodes 104c and 104d, the sidewalls of the insulating layer 105c may be substantially aligned with sidewalls of the overlying electrodes 104d, and the sidewalls of the electrode 104c laterally extend beyond sidewalls of the insulating layer 105c and the electrode 104d. The insulating layer 105d is vertically sandwiched between and physically contact the electrodes 104d and 104e, the sidewalls of the insulating layer 105d may be substantially aligned with sidewalls of the overlying electrodes 104e, and the sidewalls of the electrode 104d laterally extend beyond sidewalls of the insulating layer 105d and the electrode 104e.

The footprint of the insulating layer 105a is substantially equal to the footprint of the electrode 104b. The footprint of the insulating layer 105b is substantially equal to the footprint of the electrode 104c. The footprint of the insulating layer 105c is substantially equal to the footprint of the electrode 104d. The footprint of the insulating layer 105d is substantially equal to the footprint of the electrode 104e. The footprints (e.g., areas) of the electrodes of the capacitor 101 are gradually decreased from bottom to top. For example, the footprint (e.g., area) of the electrode 104a is larger than the footprint of the electrode 104b, the footprint of the electrode 104b is larger than the footprint of the electrode 104c, the footprint of the electrode 104c is larger than the footprint of the electrode 104d, and the footprint of the electrode 104d is larger than the footprint of the electrode 104e.

In some embodiments, the widths of the electrode 104e and the insulating layer 105d are substantially equal to the width We of the mask layer 106e (FIG. 1M); the widths of the electrode 104d and the insulating layer 105c are substantially equal to the width Wd of the mask layer 106d (FIG. 1K); the widths of the electrode 104e and the insulating layer 105b are substantially equal to the width We of the mask layer 106c (FIG. 1I); the widths of the electrode 104b and the insulating layer 105a are substantially equal to the width Wb of the mask layer 106b (FIG. 1G); and the width of the electrode 104a is substantially equal to the width Wa of the mask layer 106a (FIG. 1E).

In the embodiments, during the formation of the electrodes and insulating layers of the capacitor 110, one mask layer is used for patterning the stack structure to form the capacitor, and the capacitor is formed to have a stepped structure through trimming the mask layer and etching the stack structure. In some embodiments, the trimming process does not include photolithograph and does not use photomask. As such, only one mask layer and only one photomask may be used for forming the capacitor. The one photomask is used at the process shown in FIG. 1D where the mask layer 106a is initially formed. However, the disclosure is not limited thereto.

Referring to FIG. 1O, thereafter, a dielectric structure 111 is formed over the substrate 100, and a plurality of contact vias CV1-CV5 and conductive lines M1/M2 are formed in the dielectric structure 111 and electrically connected to the capacitor 110. The dielectric structure 111 may be a single layer structure or a multi-layer structure. For example, the dielectric structure 111 may include a dielectric layer 111a and a dielectric layer 111b disposed on the dielectric layer 111a. The forming method and materials of the dielectric structure 111 may be selected from the same candidate forming methods and materials of the dielectric layer 103 or the dielectric layer 101, which are not described again here.

In some embodiments, the contact vias CV1-CV5 penetrate through the dielectric layer 111a and landing on the electrodes 104a-104e, respectively. The contact vias CV1-CV5 may also be referred to as conductive contacts. The conductive lines M1 and M2 may penetrate through the dielectric layer 111b to electrically connect to the contact vias CV1-CV5. In some embodiments, the top surfaces of the conductive lines M1 and M2 are substantially coplanar or level with the top surface of the dielectric layer 111b of the dielectric structure 111. The contact vias and the conductive lines may include conductive materials, such as metal, metal alloy or a combination thereof. For example, the contact vias and the conductive lines may include tungsten (W), copper (Cu), copper alloys, aluminum (Al), aluminum alloys, or combinations thereof. In some embodiments, the contact vias and the conductive lines respectively includes a barrier layer and a conductive layer disposed on the barrier layer. The barrier layer may include metal, metal nitride, or a combination thereof, such as titanium, titanium nitride, tantalum nitride, or combinations thereof. The conductive layer may include copper or other suitable metal. In some embodiments, the contact vias CV1-CV5 and the conductive lines M1, M2 may be formed by single damascene processes, dual-damascene processes, or the like.

In some embodiments, the conductive lines M1 and M2 are separated (e.g., electrically separated) from each other and connected to different contact vias of the contact vias CV1-CV5. For example, the conductive line M1 is electrically connected to the conductive vias CV1, CV3, CV5 that are landing on the electrodes 104a, 104c, and 104e, while the conductive line M2 is electrically connected to the conductive vias CV2, CV4 that are landing on the electrodes 104b and 104d. That is to say, the electrodes 104a, 104c, and 104e of the capacitor 110 are electrically connected to each other through the contact vias CV1, CV3, CV5, and the conductive line M1, and the electrodes 104b and 104d are electrically connected to each other through the contact vias CV2, CV4 and the conductive line M2. However, the disclosure is not limited thereto. For example, the connection manner of the electrodes 104a-104e, the number of the conductive lines, and the connection manner between the contact vias and the conductive lines are not limited thereto.

In some other embodiments, the electrodes of the capacitor 110 may be divided into three sets of electrodes. The three sets of the electrodes are electrically connected to three separate conductive lines through contact vias landing thereon. In some embodiments, one of the three sets of electrodes includes a single electrode, while the other two sets of the electrodes each include multiple electrodes that are connected to each other. For example, a first conductive line may be electrically connected to the contact via CV5, and further electrically connected to the electrode 104e through the contact via CV5; a second conductive line may be electrically connected to the contact vias CV1 and CV3, such that the electrodes 104a and 104c are electrically connected to each other through the contact vias CV1, CV3 and the second conductive line; and a third conductive line may be electrically connected to the contact vias CV2 and CV4, such that the electrodes 104b and 104d are electrically connected to each other through the contact vias CV2, CV4 and the third conductive line. Alternatively, a first conductive line may be electrically connected to the contact via CV1, and further electrically connected to the electrode 104a through the contact via CV1; a second conductive line may be electrically connected to the contact vias CV2 and CV4, such that the electrodes 104b and 104d are electrically connected to each other through the contact vias CV2, CV4 and the second conductive line; and a third conductive line may be electrically connected to the contact vias CV3 and CV5, such that the electrodes 104c and 104e are electrically connected to each other through the contact vias CV3, CV5 and the third conductive line.

In some other embodiments, two of the three sets of electrodes each includes a single electrode, while the other one set of the electrodes includes multiple electrodes that are connected to each other. For example, a first conductive line is electrically connected to the contact via CV2, and further electrically connected to the electrode 104b through the contact via CV2; a second conductive line is electrically connected to the contact via CV4, and further electrically connected to the electrode 104d through the contact via CV4; and a third conductive line is electrically connected to the contact vias CV1, CV3, CV5, such that the electrodes 104a, 104c, and 104e are electrically connected to each other through the contact vias CV1, CV3, CV5 and the third conductive line.

In yet another embodiment, the electrodes of the capacitor may be divided into four sets of electrodes electrically connected to four separated conductive lines. For example, a first conductive line is electrically connected to the electrode 104a through the contact via CV1; a second conductive line is electrically connected to the electrode 104c through the contact via CV3; a third conductive line is electrically connected to the electrode 104e through the contact via CV5; and a fourth conductive line is electrically connected to the contact vias CV2, and CV4, such that the electrodes 104b and 104d are electrically connected to each other through the contact vias CV2, CV4 and the fourth conductive line. Other suitable connection manner may also be used.

Referring to FIG. 1P, in some embodiments, dielectric layers 112 and 113 are formed over the capacitor 101 and the dielectric structure 111. In some embodiments, the dielectric layers 112 and 113 may include different materials. For example, the dielectric layer 112 may include an inorganic dielectric material, such as silicon nitride. The dielectric layer 113 may include an organic dielectric material (e.g., a polymer material), such as polyimide. However, the disclosure is not limited thereto. Other suitable dielectric materials may also be used to form the dielectric layers 112 and 113. In some embodiments, the dielectric layer 112 may also be referred to as a passivation layer, and the dielectric layer 113 may also be referred to as a protection layer. The dielectric layers 112 and 113 may be formed by suitable deposition processes, such as CVD.

Referring to FIG. 1P and FIG. 1Q, in some embodiments, openings 115a and 115b are formed through the dielectric layers, such as the dielectric layer 113, 112, the dielectric structure 111 and the dielectric layer 103, so as to expose portions of the conductive lines M1, M2, and portions of the conductive features 102 of the interconnection structure. The formation of the openings 115a and 115b may include the following processes: a patterned mask layer may be formed on the dielectric layer 113; the patterned mask layer has openings exposing portions of the top surface of the dielectric layer 113; thereafter, etching process(es) may be formed using the patterned mask layer as an etching mask, so as to remove portions of the dielectric layers 113, 112, 111, 103 exposed by the patterned mask layer, thereby forming openings in the dielectric materials and exposing the conductive material. The etching process may have high etching selectivity ratio of the dielectric material to conducive material and may stop at which the conductive material (e.g., the conductive lines M1, M2, and the conductive features 102a, 102b) is exposed.

In some embodiments, the openings 115a and 115b expose portions of the top surfaces and sidewalls of the conductive lines M1 and M2, and portions of the top surfaces of the conductive features 102, but the disclosure is not limited thereto. In some embodiments, portions of the dielectric layers 113/112 directly over the conductive lines M1 and M2 are removed by the etching processes, while portions of the dielectric layers 111a and 103 directly below the conductive lines M1 and M2 are masked by the conductive lines and are not removed by the etching process.

Referring to FIG. 1Q and FIG. 1R, thereafter, conductive plug 120a and 120b are formed in the openings 115a and 115b and may further protrude from top surface of the dielectric layer 113. The conductive plugs 120a and 120b are electrically connected to the conductive lines M1 and M2 and the conductive features 102 of the interconnection structure, respectively. The conductive plugs 120a/120b may include plug portions 118 embedded in the dielectric layer, and protruding portions 119 protruding over the top surface of the dielectric layer 13. The materials of the conductive plug may include metal, metal alloy, or a combination thereof, such as tungsten (W), copper (Cu), copper alloys, aluminum (Al), aluminum alloys, or combinations thereof. The plug portion 118 and the protruding portion 119 may be formed the same material or different materials. In some embodiments, the plug portion 118 include metallic materials, while the protruding portion 119 may include metallic materials and/or solder materials. In some embodiments, at least the plug portion 118 of the conductive plug 120a/120b includes a barrier layer and a conductive layer disposed on the barrier layer. The barrier layer may line the surfaces of the opening 115a/115b and surrounds sidewalls and bottom surfaces of the conductive layer. The barrier layer may include metal, metal nitride, or a combination thereof, such as titanium, titanium nitride, tantalum nitride, or combinations thereof. The conductive layer may include copper or other suitable metal. In some embodiments, the conducive plugs 120a and 120b may be formed by forming conductive materials over the substrate 100 to fill in the openings 115a and 115b and cover the top surface of the dielectric layer 113. Thereafter, the conductive materials may be patterned by photolithograph and etching processes. However, the disclosure is not limited thereto. Other suitable technique may also be used to form the conducive plugs 120a and 120b.

Referring to FIG. 1R, in some embodiments, the plug portion 118 may include a lower part P1 and an upper part P2 disposed on the lower part P1. The lower part P1 may be embedded in the dielectric structure 111 and the dielectric structure 103, and the top surface of the lower part P1 may be substantially coplanar with the top surfaces of the conductive lines M1/M2 and the dielectric structure 111. The upper part P2 may be embedded in the dielectric layers 112 and 113, and overlies the lower part P1 and the corresponding conductive line M1/M2.

In some embodiments, the lower part P1 is laterally aside and in physical and electrical contact with the conductive line M1/M2. The top portion of the lower part P1 may border and physical contact a sidewall of the conductive line M1/M2. The upper part P2 is disposed on the lower part P1 and covers a portion of the top surface of the conductive line M1/M2. The bottom width of the upper part P2 is larger than the top width of the lower part P1. Herein, the bottom width of the upper part P2 and the top width of the lower part P1 are the widths thereof measured at the cross-section taken along the top surfaces of the dielectric structure 111 and the conductive lines M1 and M2 (or, the plane including the top surfaces of the dielectric structure 111 and the conductive lines M1 and M2). In other words, the upper part P2 has an extending portion that extends beyond a sidewall of the lower part P1 and covers a portion of the top surface of the conductive line M1/M2.

As shown in FIG. 1R, the first sidewalls of the lower part P1 and the upper part P2 are continuous and aligned, while the second sidewalls of the lower part P1 and the upper part P2 are non-continuous and not aligned. In some embodiments, the second sidewalls of the lower part P1 and the upper part P2 may be connected to each other through the bottom surface of the upper part P2 that is in contact with the corresponding conductive line M1/M2.

As such, a semiconductor structure S1 including the capacitor 110 is formed. In some embodiments, the protruding portions 119 of the conductive plugs 120a/120b may serve as an external connection of the semiconductor structure S1, and may also be referred to as a conductive connector. In some embodiments, the protruding portion 119 may have a curved, or a rounding surface, but the disclosure is not limited thereto. In some other embodiments, the cross-sectional shape of the protruding portion 119 may be square, rectangular, or the like, or any other suitable shape. In some embodiments, the capacitor 110 may be electrically connected to the interconnect wirings underlying the dielectric structure 103 through the conductive plugs 120a/120b and may further electrically coupled to the devices disposed in and/or on the substrate 100, but the disclosure is not limited thereto. In some embodiments, the capacitor 110 is embedded in and surrounded by the dielectric layer 111a at back-end-of-line (BEOL) and may be physically separated from other devices (e.g., memory devices). However, the disclosure is not limited thereto.

Figure 2A:
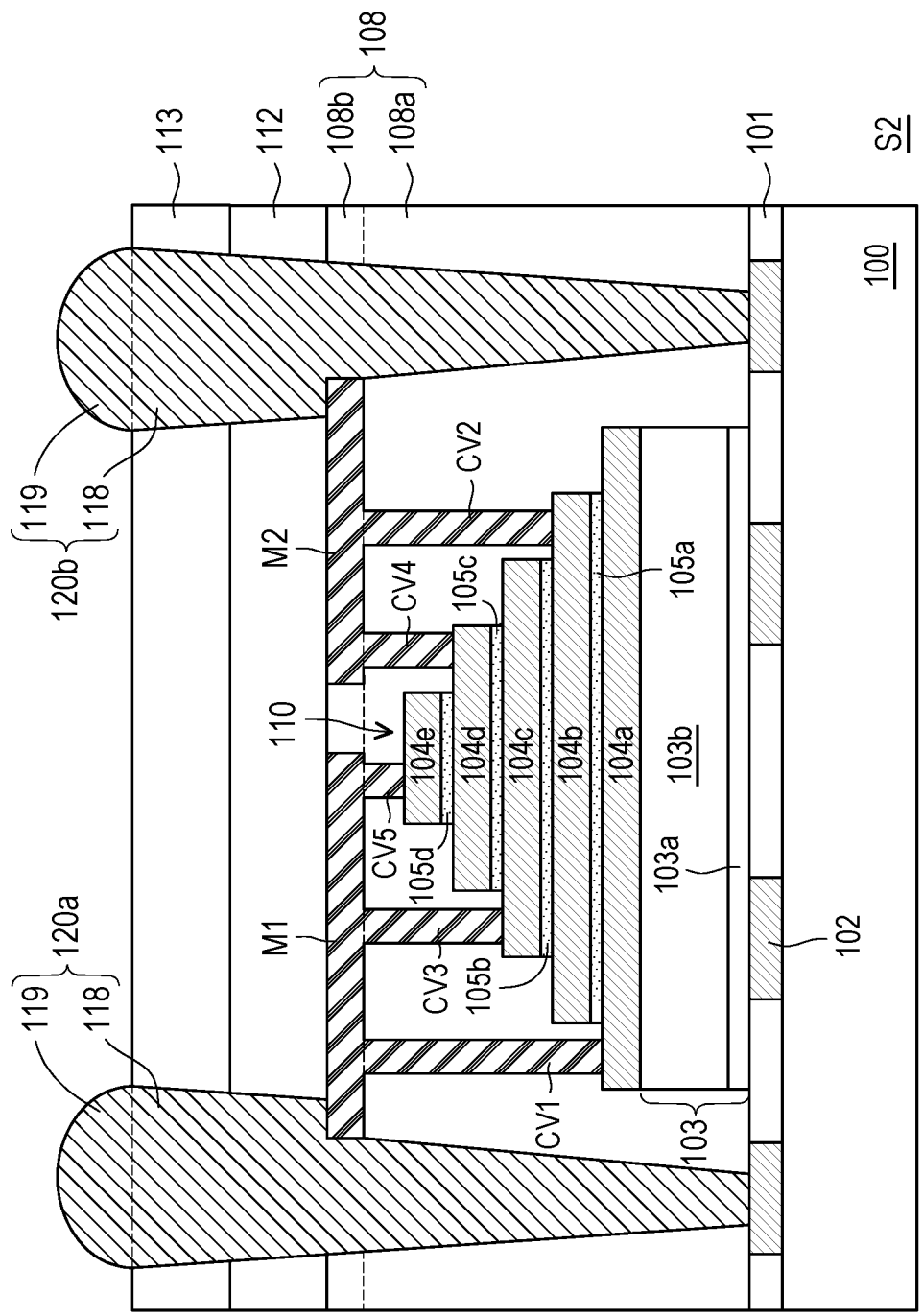
FIG. 2A and FIG. 2B are cross-sectional views illustrating semiconductor structures including MIM capacitors according to some other embodiments of the disclosure.
Figure 2B:
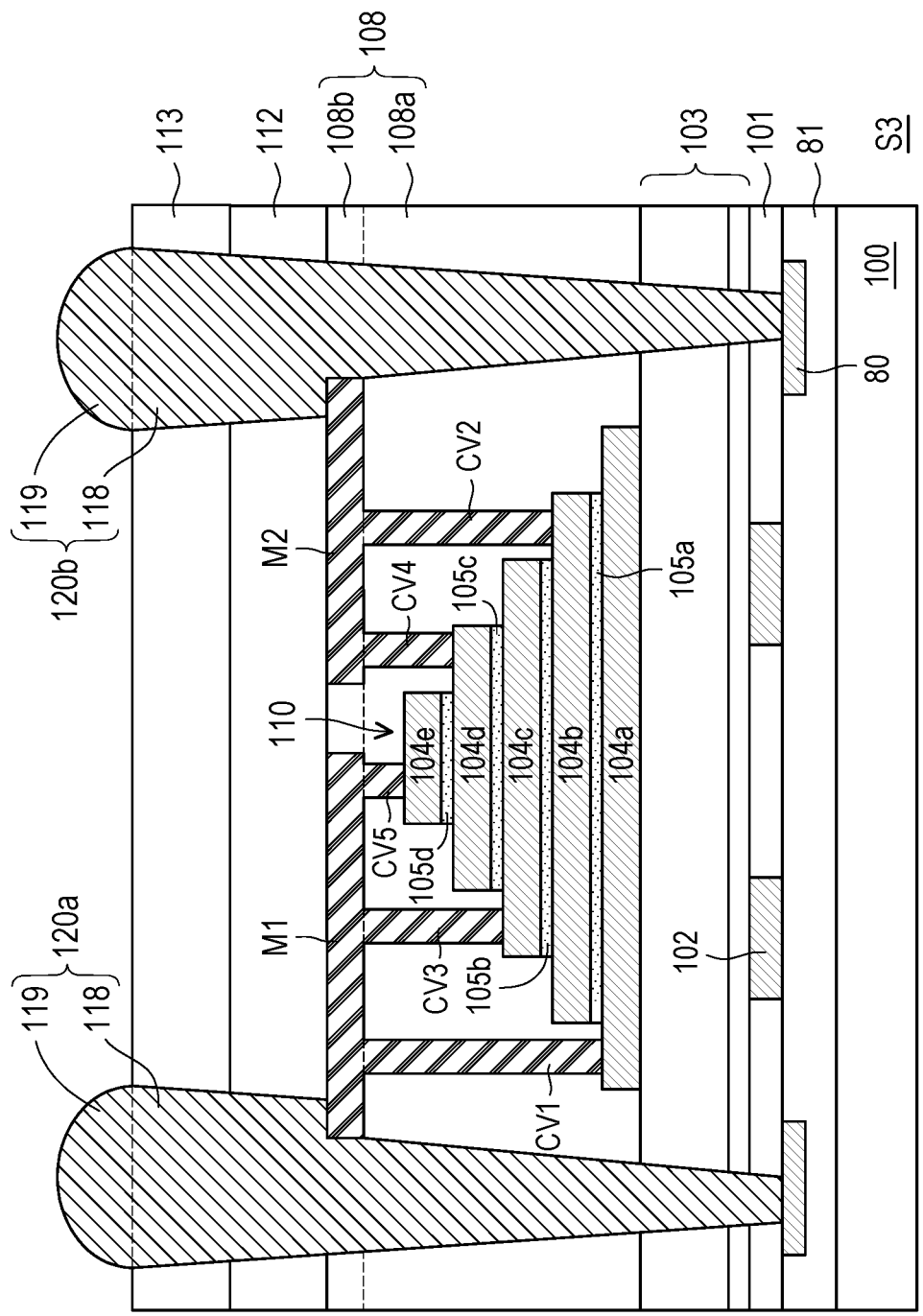

FIG. 2A and FIG. 2B are cross-sectional views illustrating semiconductor structures including MIM capacitors according to some other embodiments of the disclosure.

FIG. 2A illustrates a semiconductor structure S2 similar to the semiconductor S1, except that the dielectric structure 103 has a less width. In some embodiments, the dielectric structure 103 may be patterned to have substantially the same footprint as the bottommost electrode 104a of the capacitor 110. The patterning of the dielectric structure 103 may be performed during the etching process (e.g., second sub-etching process) shown in FIG. 1L to FIG. 1M. Additionally, or alternatively, the patterning of the dielectric structure 103 may be performed after the etching process shown in FIG. 1L to FIG. 1M (e.g., after the stack structure ST1 has been patterned as the capacitor 101).

Referring to FIG. 2A, in some embodiments, the sidewalls of the dielectric structure 103 may be substantially aligned with the sidewalls of the electrode 104a of the capacitor 110, and may be covered by the dielectric structure 108. The dielectric structure 108 further extends to cover the top surface of the dielectric layer 101 and/or the top surfaces of the conductive features 102.

FIG. 2B illustrates a semiconductor structure S3 similar to the semiconductor structure S1, except that the conductive plugs 120a/120b further extend through the dielectric layer 101 and are electrically connected to conductive features 80 of the interconnection structure over the substrate 100. The conductive features 80 may be embedded in the dielectric layer 81 underlying the dielectric layer 101.

In the foregoing embodiments, both opposite sides of the capacitor 110 have stepped structure or ladder structure, and the capacitor 110 may have symmetric structure or asymmetric structure.

FIG. 3A and FIG. 3B are cross-sectional views illustrating MIM capacitors according to some other embodiments of the disclosure. For the sake of brevity, the components over the capacitors are not specifically shown in FIG. 3A/3B.

Referring to FIG. 3A, in some embodiments, a capacitor 210 includes a plurality of electrodes 204a-204e and a plurality of insulating layers 205a-205d alternately stacked over the substrate 100. The capacitor 210 has a first side Sd1 and a second side Sd2 opposite to each other. In some embodiments, one of the first side Sd1 and the second side Sd2 has a stepped structure, while the other one of the first side Sd1 and the second side Sd2 does not have a stepped structure. For example, the second side Sd2 of the capacitor 210 has the stepped structure, which is similar to that described in the capacitor 110. In some embodiments, the sidewalls of the electrodes 204a-204e and the insulating layers 205a-205d at the first side Sd1 are substantially aligned with each other.

Referring to FIG. 3B, in some embodiments, a capacitor 310 includes a plurality of electrodes 304a-304e and a plurality of insulating layers 305a-305d alternately stacked over the substrate 100. The capacitor 310 is similar to the capacitor 210, except that the first side Sd1 of the capacitor 310 has the stepped structure, while the sidewalls of the electrodes 304a-304e and the insulating layers 305a-305d at the second side Sd2 are substantially aligned with each other.

FIG. 4A to FIG. 4J are cross-sectional views illustrating a method of forming a semiconductor structure including the capacitor 210. It is understood that, the capacitor 310 may be formed by similar processes descried below. The method of forming the capacitor 210 is similar to the above-described method for forming the capacitor 110, except that one of the opposite sides of the mask layer is trimmed, while the other one of the opposite sides of the mask layer is not trimmed during the trimming process.

Figure 4A:
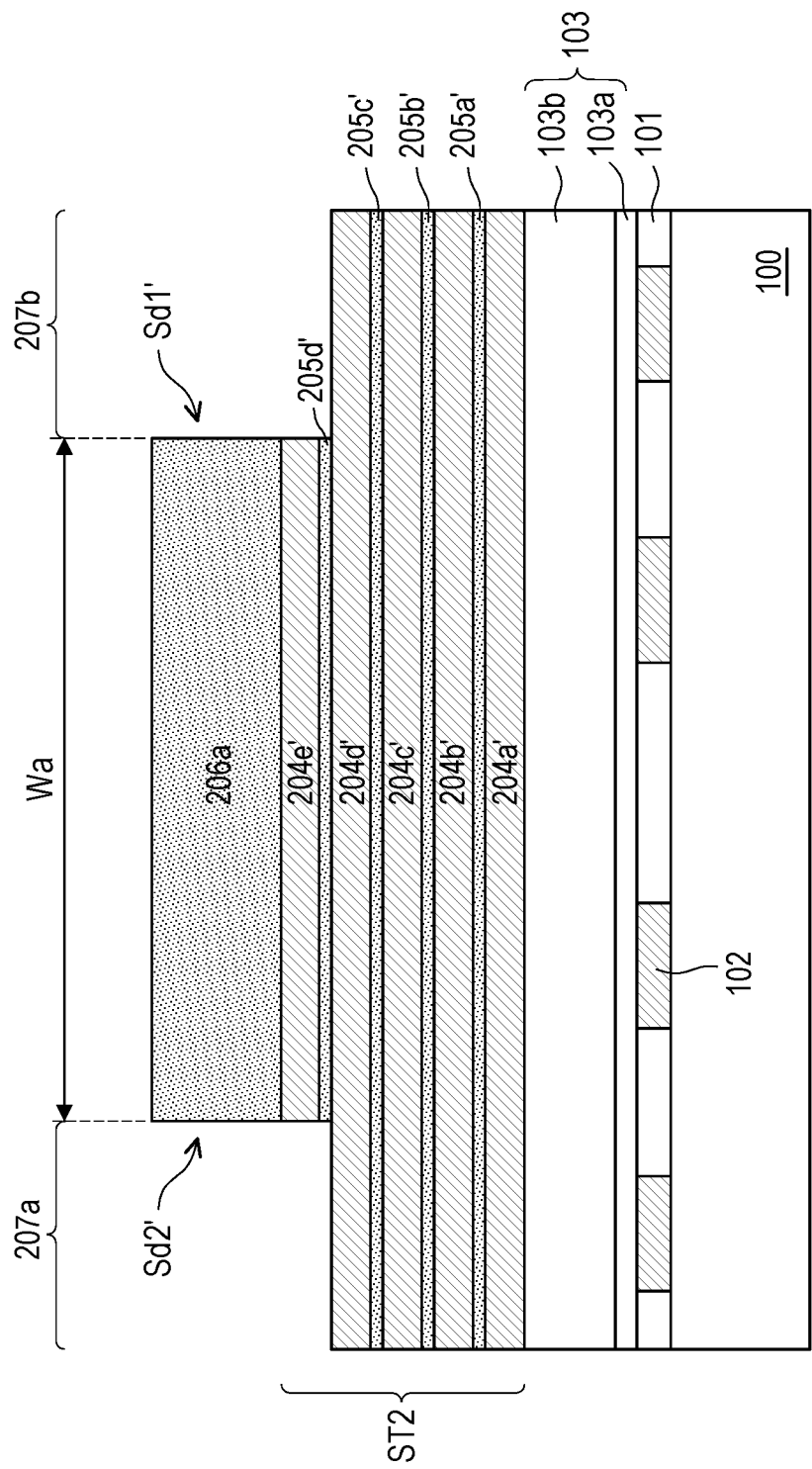
FIG. 4A to FIG. 4J are schematic cross-sectional views illustrating a method of manufacturing a semiconductor structure including a metal-insulator-metal (MIM) capacitor according to some embodiments of the disclosure.

Referring to FIG. 4A, in some embodiments, processes similar to those illustrated in FIG. 1A to FIG. 1E are performed. For example, a stack structure ST2 is formed on the dielectric structure 103 over the substrate 100. The stack structure ST2 includes a plurality of conductive layers 204a'-204e' and a plurality of insulating layers 205a'-205d' alternately stacked over the substrate 100. A mask layer 206a is formed over the stack structure ST2. The mask layer 206a has openings 207a and 207b at opposite sides of the mask layer 206a. Etching process(es) are performed to remove portions of the conductive layer 204e' and the insulating layer 205d' exposed by the mask layer 206a.

Figure 4B:
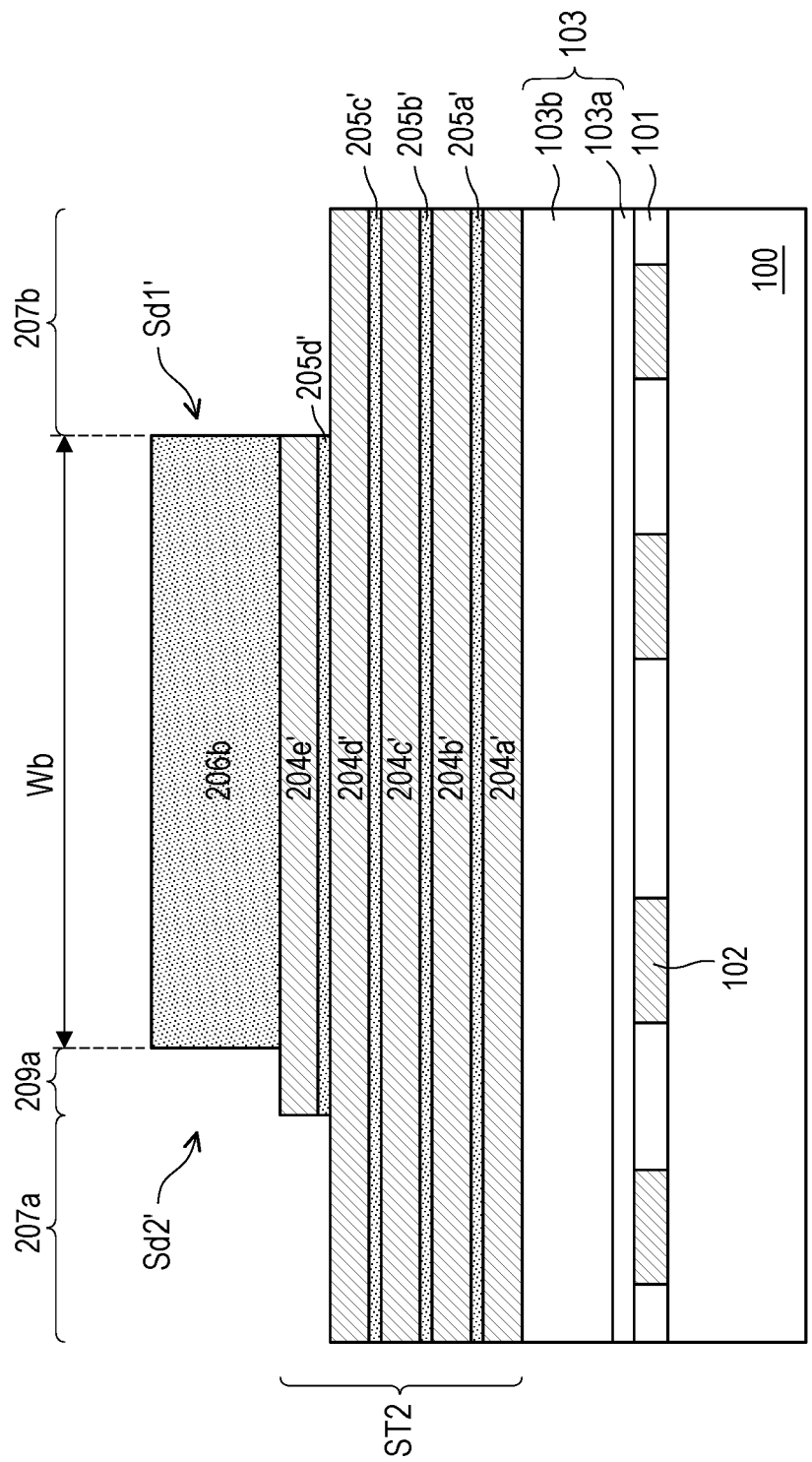

Referring to FIG. 4A and FIG. 4B, in some embodiments, a trimming process is performed to remove a portion of the mask layer 206a, so as to form a mask layer 206b having a size (e.g., width) smaller than that of the mask layer 206a, and a portion of the top surface of the conductive layer 204e' is further exposed by the mask layer 206a. In some embodiments, the mask layer 206a has a first side Sd1' and a second side Sd2' opposite to each other. In some embodiments, one of the opposite sides Sd1' and Sd2' is trimmed, while the other one of the opposite sides Sd1' and Sd2' is substantially not trimmed. For example, the trimming process may partially remove the mask layer 206a from the second side Sd2', and the first side Sd1' of the mask layer 206a is substantially not removed by the trimming process. As such, a trimmed region 209a is formed adjacent to the opening 207a, while no trimmed region is formed adjacent to the opening 207b.

In some embodiments, before the trimming process is performed, the structure shown in FIG. 4A (e.g., a wafer in the manufacturing process) may be tilted, for example, toward the first side Sd1', such that the second side Sd2' is over the first side Sd1'. Thereafter, with the structure being tilted, etching gas or etchant is applied to the structure, so as to remove a portion of the mask layer 206a from the second side Sd2'. The tilt of the structure may protect the first side Sd1' from being removed by the etching gas or etchant. As such, the trimming process may remove a portion of the mask layer 206a from the second side Sd2', while the first side Sd1' is substantially not removed. The above-described method for forming such a trimming process is merely for illustration, and the disclosure is not limited thereto. Other suitable method may also be used.

Figure 4C:
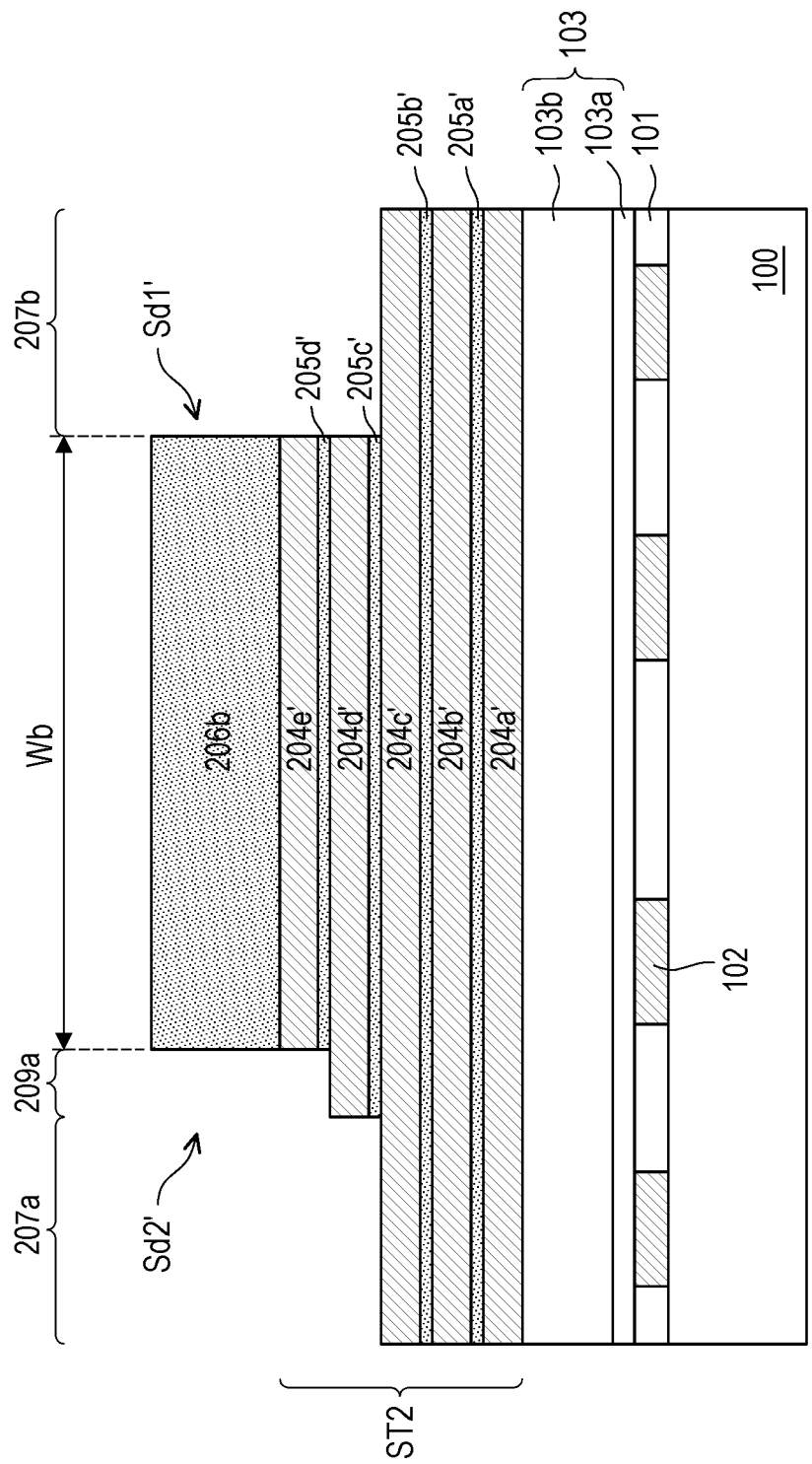

Referring to FIG. 4B and FIG. 4C, etching processes are performed to removed portions of the stack structure ST2 (e.g., portion of the conductive layers 204e', 204d' and insulating layers 205d' and 105c') exposed by the mask layer 206b, and portions of the conductive layer 204c' are exposed.

Thereafter, the trimming process of the mask layer and the etching process of the conductive layers and insulating layers are repeated, so as to form the capacitor. In the embodiments, the structure are tilted while performing the trimming process, such that the second side Sd2' is trimmed, while the other side Sd1' is substantially not trimmed.

Figure 4D:
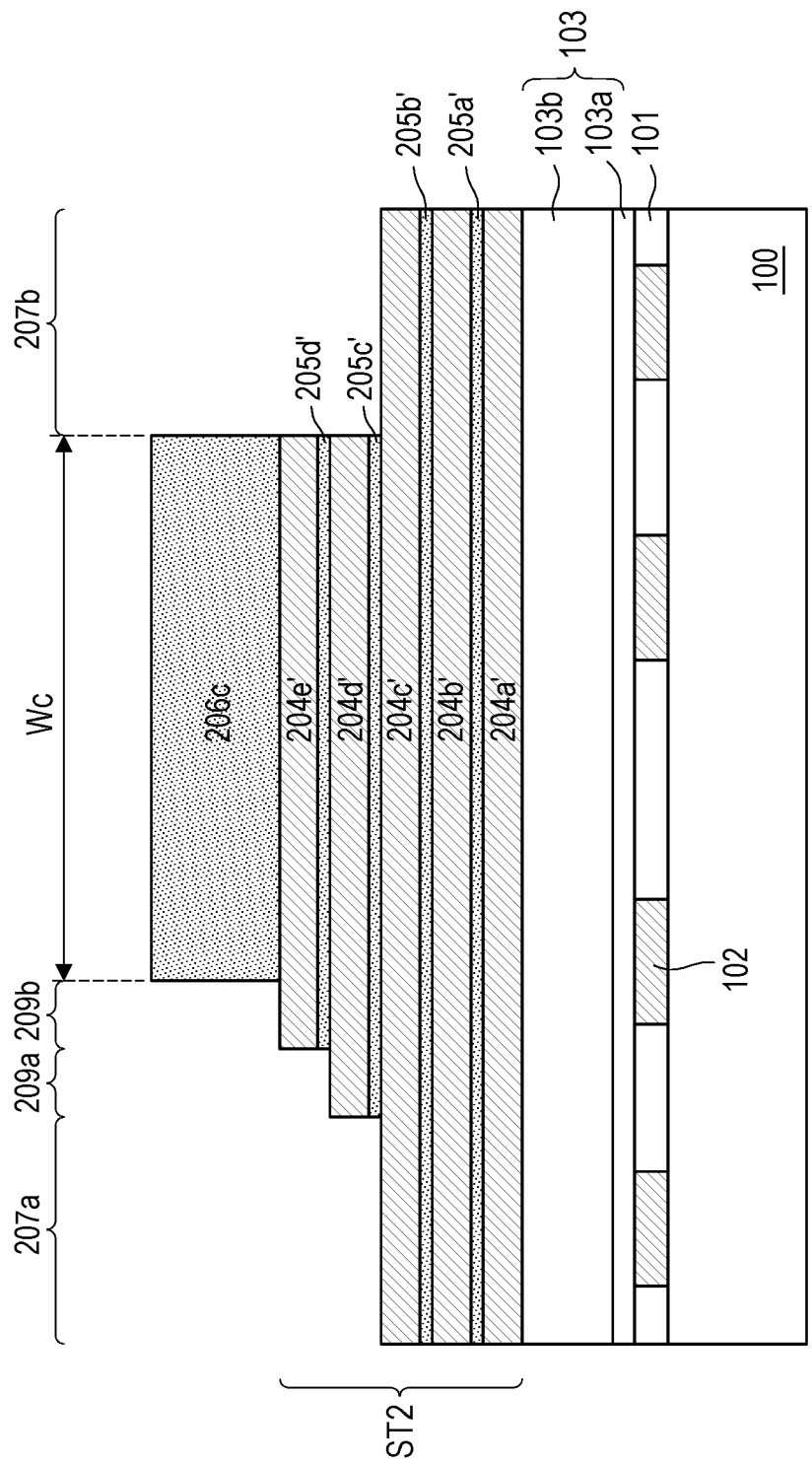
Figure 4E:
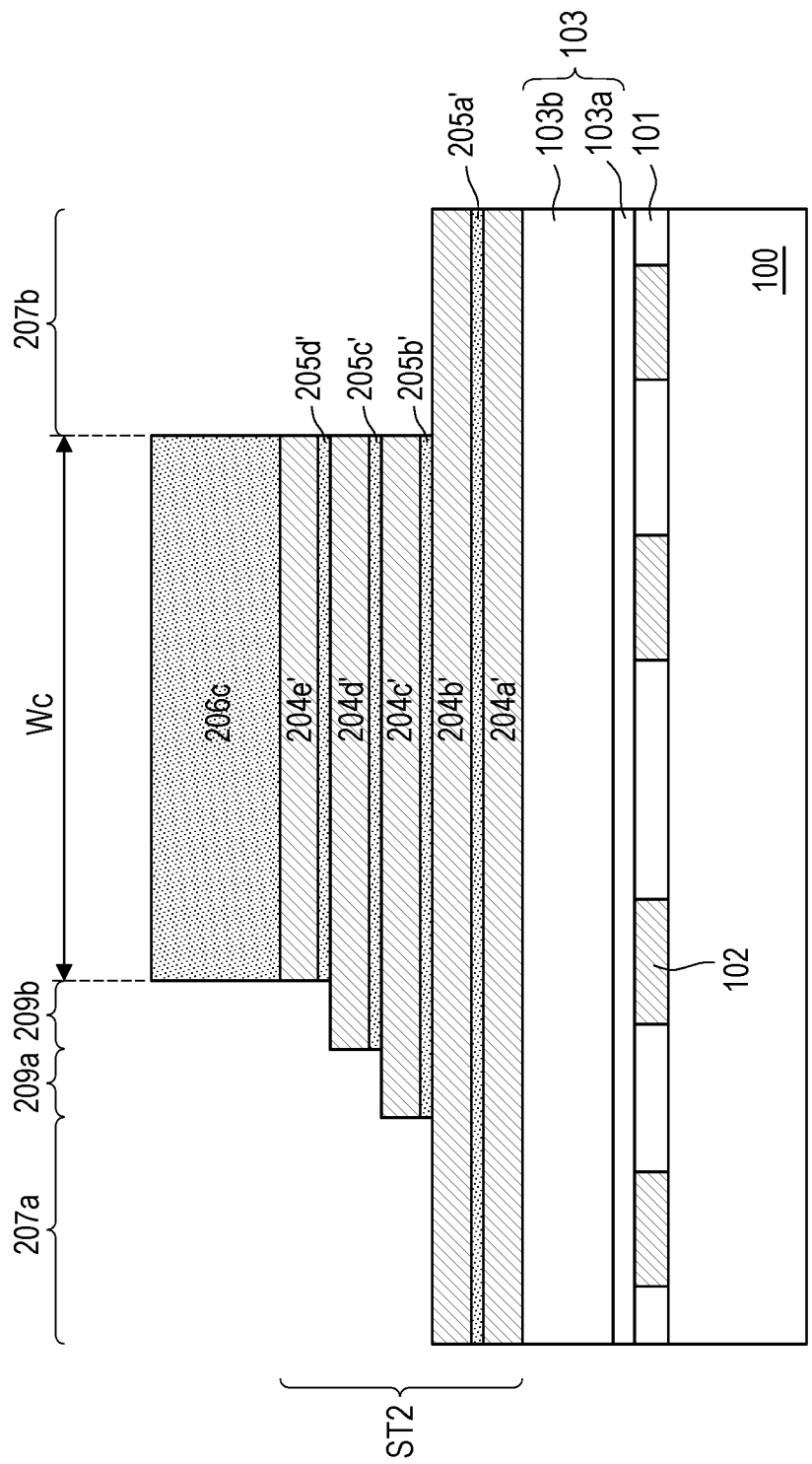

For example, as shown in FIG. 4D, the mask layer 206b is trimmed to form a mask layer 206c, and a trimmed region 209b is formed adjacent to the trimmed region 209a. Referring to FIG. 4D and FIG. 4E, portions of the conductive layers 204c'-204e' and the insulating layers 205b'-205d' exposed by the mask layer 206c are removed by etching processes using the mask layer 206c as an etching mask, and portions of the conductive layer 204b' are exposed.

Figure 4F:
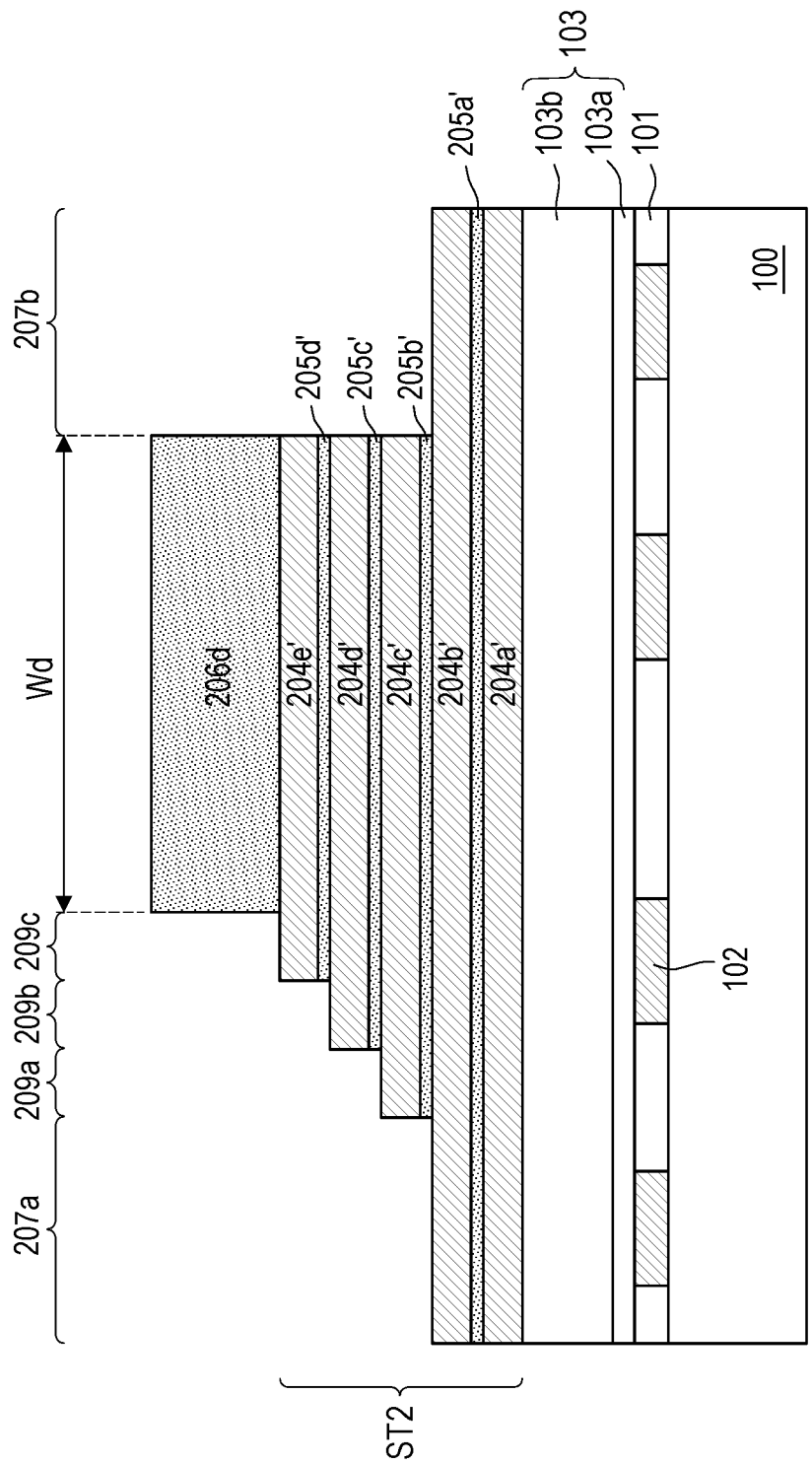
Figure 4G:
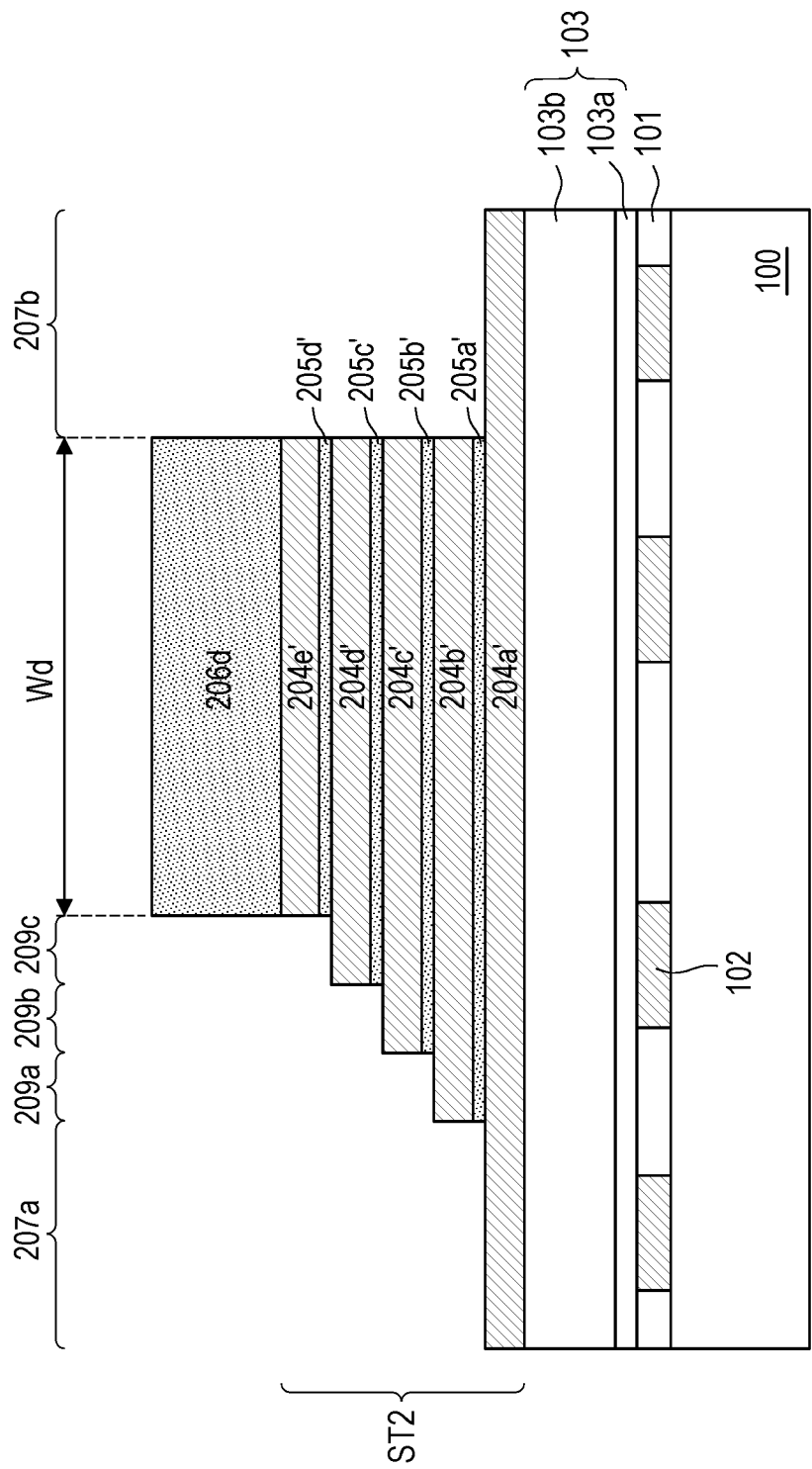

Referring to FIG. 4F, the mask layer 206c is trimmed to form a mask layer 206d, and a trimmed region 209c is formed adjacent to the trimmed region 209b. Referring to FIG. 4F and FIG. 4G, portions of the conductive layers 204b'-204e' and the insulating layers 205a'-205d' exposed by the mask layer 206d are removed by etching processes using the mask layer 206d as an etching mask, and portions of the conductive layer 204a' are exposed.

Figure 4H:
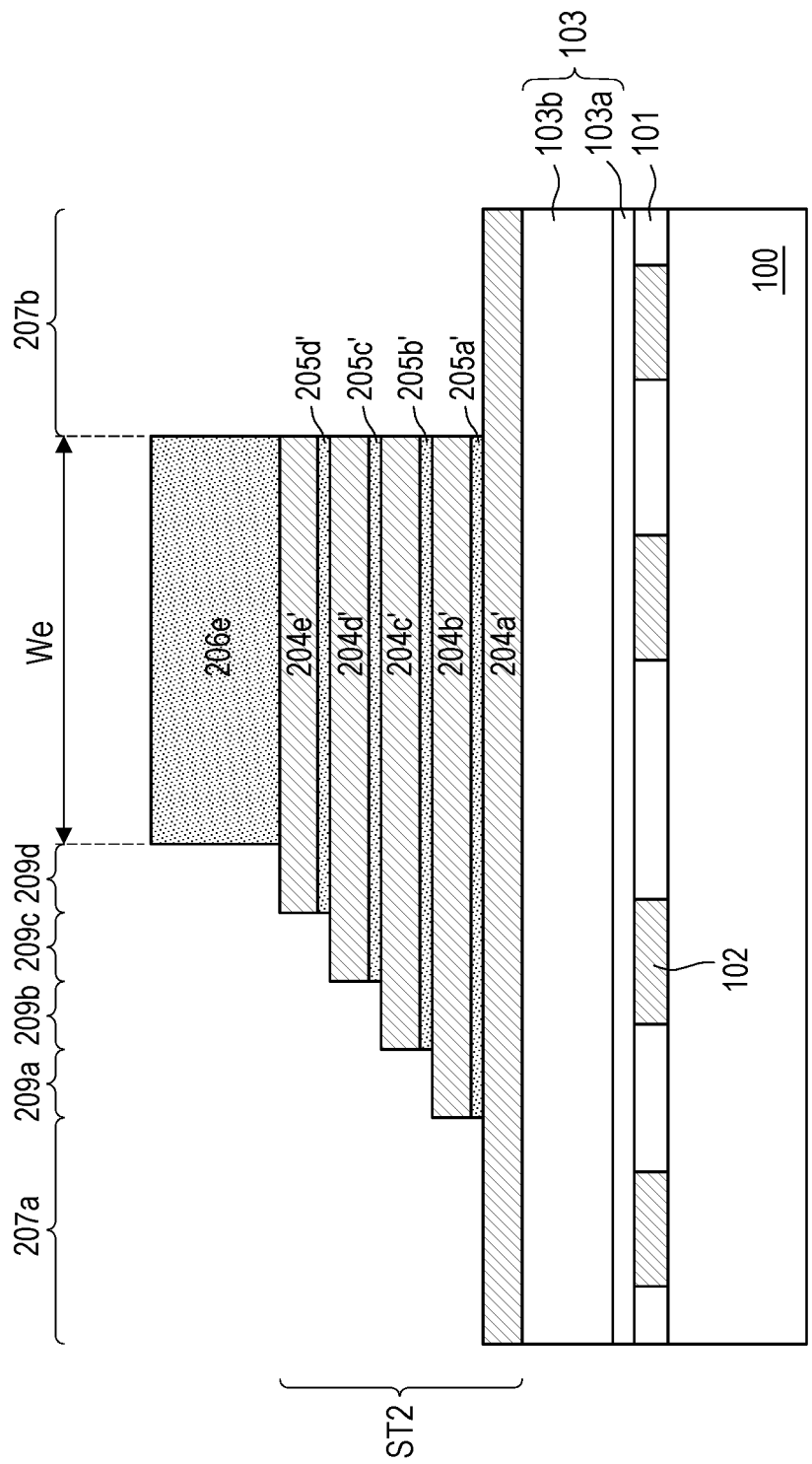
Figure 4I:
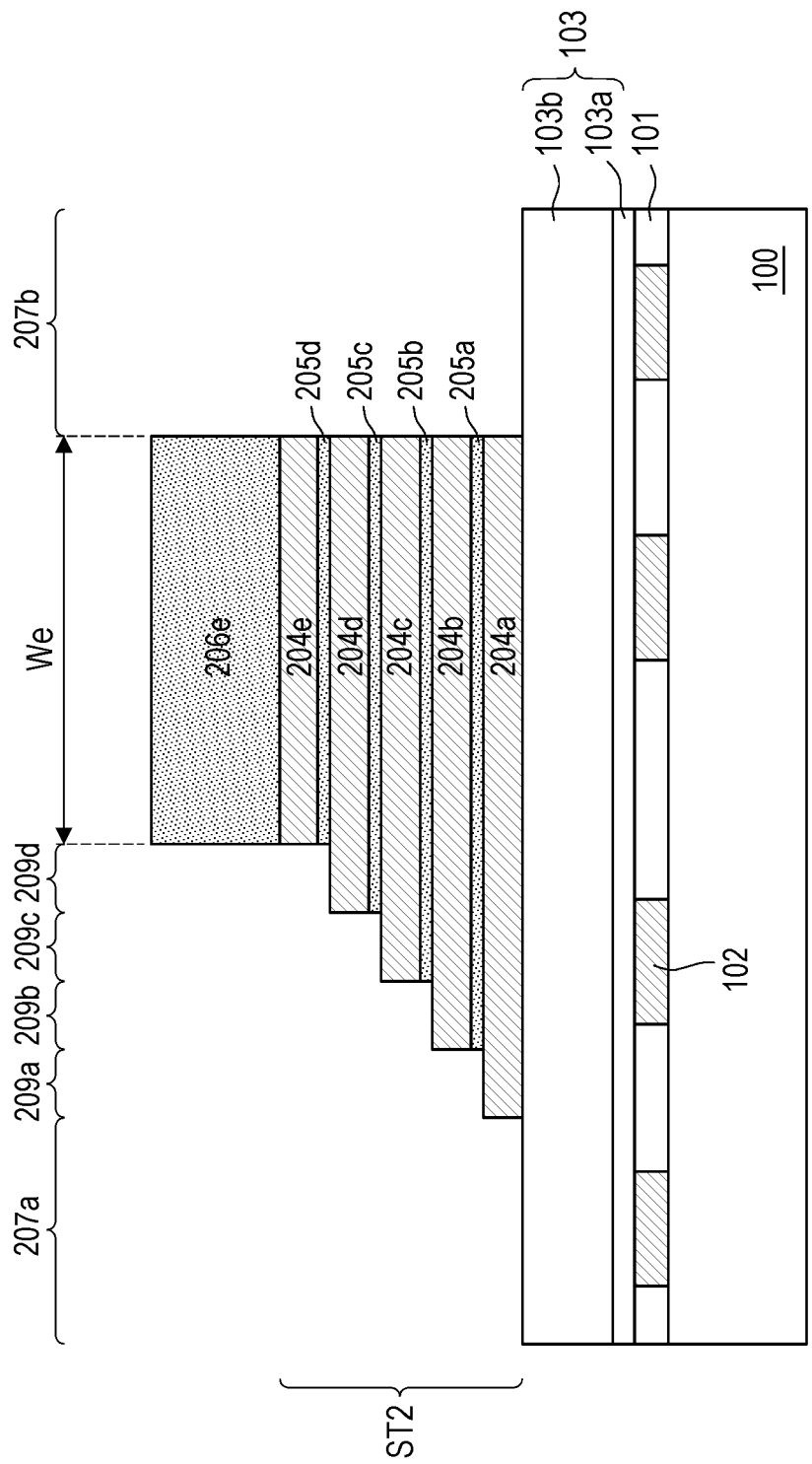

Referring to FIG. 4H, the mask layer 206d is trimmed to form a mask layer 206e, and a trimmed region 209d is formed adjacent to the trimmed region 209c. Referring to FIG. 4H and FIG. 4I, portions of the conductive layers 204a'-204e' and the insulating layers 205a'-205d' exposed by the mask layer 206e are removed by etching processes using the mask layer 206e as an etching mask, and conductive layers 204a-204e and insulating layers 205a-205d are formed.

Figure 4J:
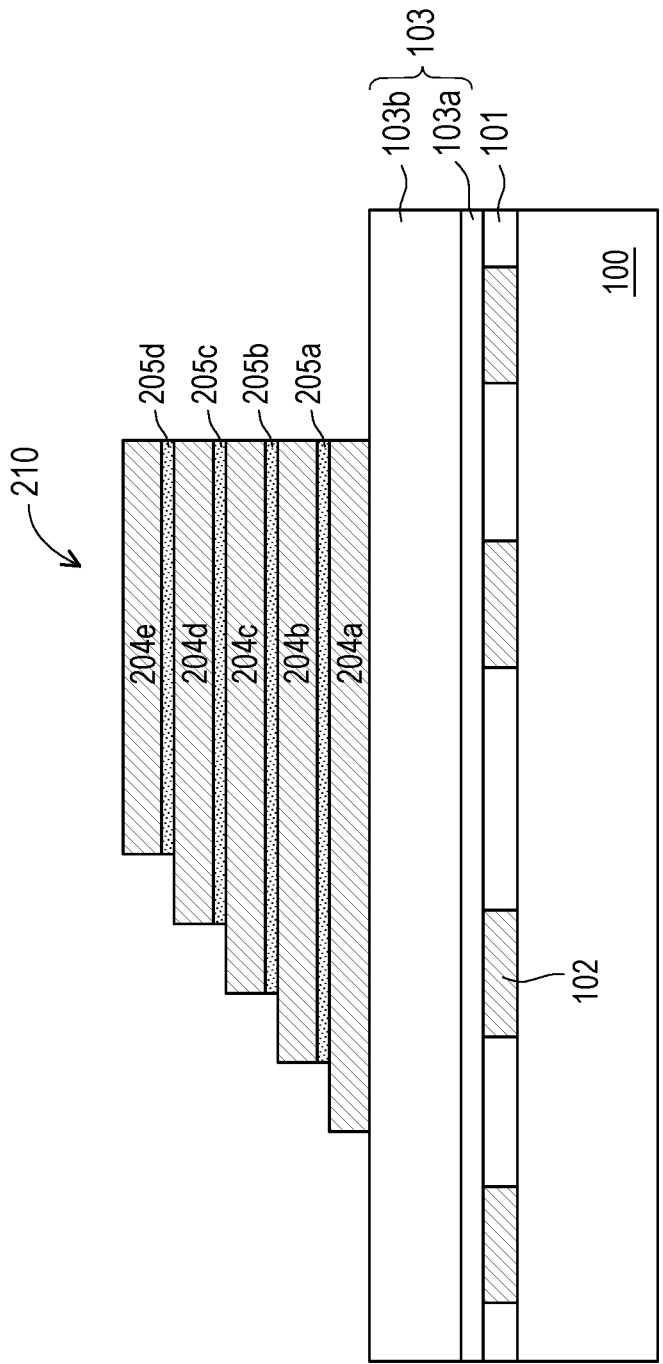

Referring to FIG. 4I and FIG. 4J, the mask layer 206e is removed, and the capacitor 210 is formed. The capacitor 210 includes the conductive layers 204a-204e and the insulating layers 205a-205d alternately stacked on the substrate 100. The conductive layer 204a-204e serve as electrodes of the capacitor 210.

In the embodiments of the disclosure, the electrode material layers and insulating layers for capacitor are initially stacked over the substrate at back-end-of-line (BEOL), and one mask layer is formed over the stack structure. Thereafter, the stack structure is patterned using the one mask layer to form the capacitor, and the capacitor is formed to have a stepped structure. The number of the mask used for forming the capacitor is independent of and less than the number of the layers includes in the capacitor. Therefore, the number of the mask and photomask used for the process is decreased and minimum, the forming process is easier and the cost is saved, and it may have non-breaking vacuum during the fabrication. The throughput of product may be increased. On the other hand, contacts are formed to land on the stepped structure of the capacitor, which may achieve lower contact resistance.

In accordance with some embodiments of the disclosure, a method of forming a semiconductor structure including a metal-insulator-metal (MIM) capacitor includes: forming a stack structure over a substrate, wherein the stack structure includes a plurality of electrode material layers and a plurality of insulating material layers alternately stacked over the substrate; forming a mask layer on the stack structure; and performing a patterning process on the stack structure, so as to form the MIM capacitor comprising alternately stacked electrodes and insulating layers. Performing the patterning process includes: performing a first etching process to remove a first portion of the stack structure exposed by the mask layer; performing a first trimming process on the mask layer to remove a portion of the mask layer, and a first trimmed mask layer is formed; and performing a second etching process to remove a second portion of the stack structure exposed by the first trimmed mask layer.

In accordance with some embodiments of the disclosure, a method of forming a semiconductor structure including a MIM capacitor include: forming a stack structure including a bottom electrode layer, a lower insulating layer, a middle electrode layer, an upper insulating layer and a top electrode layer over a dielectric structure; forming a mask layer over the top electrode layer; performing a first etching process to remove portions of the top electrode layer and the upper insulating layer exposed by the mask layer; performing a first trimming process on the mask layer to form a first trimmed mask layer having a width less than that of the mask layer, such that a portion of the top electrode layer is further exposed by the first trimmed mask layer; performing a second etching process to remove portions of the top electrode layer, the upper insulating layer, the middle electrode layer and the lower insulating layer exposed by the first trimmed mask layer; and performing a second trimming process on the first trimmed mask layer to form a second trimmed mask layer; and performing a third etching process to remove portions of the top electrode layer, the upper insulating layer, the middle electrode layer, the lower insulating layer, and the bottom electrode layer exposed by the second trimmed mask layer.

In accordance with some embodiments of the disclosure, a semiconductor structure includes a dielectric structure and a MIM capacitor disposed over the dielectric structure. The MIM capacitor includes: a bottom electrode; a lower insulator, disposed over the bottom electrode; a middle electrode, disposed over the lower insulator, wherein the bottom electrode laterally extends beyond first sidewalls of the middle electrode and the lower insulator; an upper insulator, disposed over the middle electrode; and a top electrode, disposed over the upper insulator, wherein the first sidewall of the middle electrode laterally extends beyond first sidewalls of the top electrode and the upper insulator. A contact via lands on one of the bottom electrode, the middle electrode and the top electrode. A conductive line is disposed on and electrically connected to the contact via. A conductive plug is disposed laterally aside the contact via, and electrically connected to the conductive line.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A method of forming a semiconductor structure comprising a metal-insulator-metal (MIM) capacitor, comprising:
   forming a stack structure over a substrate, wherein the stack structure comprises a plurality of electrode material layers and a plurality of insulating material layers alternately stacked over the substrate;
   forming a mask layer on the stack structure;
   performing a patterning process on the stack structure, so as to form the MIM capacitor comprising alternately stacked electrodes and insulating layers, wherein performing the patterning process comprises:
      performing a first etching process to remove a first portion of the stack structure exposed by the mask layer;
      performing a first trimming process on the mask layer to remove a portion of the mask layer, and a first trimmed mask layer is formed; and
      performing a second etching process to remove a second portion of the stack structure exposed by the first trimmed mask layer;
   forming contact vias and conductive lines connected to the electrodes from above the MIM capacitor; and
   forming conductive plugs connected to the conductive lines, wherein the conductive plugs are laterally spaced apart from the MIM capacitor, and extend from above the MIM capacitor to further below a bottom side of the MIM capacitor.

2. The method of claim 1, wherein forming the mask layer comprises patterning the mask layer using a photomask; and there is free of photomask used for the first trimming process.

3. The method of claim 1, wherein the mask layer is partially trimmed during the formation of the MIM capacitor, and is not completely removed until the MIM capacitor is formed.

4. The method of claim 1, wherein the contact vias are alternately disposed at opposite sides of the MIM capacitor, such that the electrodes are alternately routed from the opposite sides of the MIM capacitor.

5. The method of claim 1, wherein each of the conductive plugs is formed to cover a sidewall and a top surface of a connected one of the conductive lines.

6. The method of claim 1, wherein each of the conductive plugs has a lower part in lateral contact with one of the connected conductive lines, and has an upper part in contact with the one connected conductive line from above the one connected conductive line.

7. The method of claim 1, wherein the first etching process removes first portions of an upper electrode material layer and an upper insulating layer exposed by the mask layer, and a first recess is formed in the upper electrode material layer and the upper insulating layer to expose a portion of a lower electrode material layer.

8. The method of claim 7, wherein the second etching process removes second portions of the upper electrode material layer and the upper insulating layer exposed by the first trimmed mask layer, a portion of the lower electrode material layer exposed by the first recess and a portion of a lower insulating layer underlying the portion of the lower electrode material layer.

9. The method of claim 1, wherein the mask layer has a first side and a second side opposite to each other, and during the first trimming process, the first side of the mask layer s trimmed, while the second side is not trimmed.

10. The method of claim 9, wherein the stack structure is tilted while performing the first trimming process.

11. A method of forming a semiconductor structure including a MIM capacitor, comprising:
   forming a stack structure comprising a bottom electrode layer, a lower insulating layer, a middle electrode layer, an upper insulating layer and a top electrode layer over a dielectric structure;
   forming a mask layer over the top electrode layer;
   performing a first etching process to remove portions of the top electrode layer and the upper insulating layer exposed by the mask layer;
   performing a first trimming process on the mask layer to form a first trimmed mask layer having a width less than that of the mask layer, such that a portion of the top electrode layer is further exposed by the first trimmed mask layer;
   performing a second etching process to remove portions of the top electrode layer, the upper insulating layer, the middle electrode layer and the lower insulating layer exposed by the first trimmed mask layer;
   performing a second trimming process on the first trimmed mask layer to form a second trimmed mask layer;
   performing a third etching process to remove portions of the top electrode layer, the upper insulating layer, the middle electrode layer, the lower insulating layer, and the bottom electrode layer exposed by the second trimmed mask layer;
   forming contact vias and conductive lines connected to the top electrode layer, the middle electrode layer and the bottom electrode layer from above the stack structure; and
   forming conductive plugs connected to the conductive lines, wherein the conductive plugs are laterally spaced apart from the stack structure, and extend from above the stack structure to further below a bottom side of the stack structure.

12. The method of claim 11, wherein the third etching process further removes a portion of the dielectric structure underlying the bottom electrode layer.

13. The method of claim 11, wherein merely one mask layer is used for the etching of the stack structure.

14. The method of claim 11, wherein after performing the third etching process, a bottom electrode, a lower insulator, a middle electrode, an upper insulator, and a top electrode are formed to constitute the MIM capacitor, wherein the MIM capacitor has a ladder structure in which the bottom electrode laterally extends beyond a sidewall of the middle electrode, and the middle electrode laterally extends beyond a sidewall of the top electrode.

15. A method of forming a semiconductor structure comprising a MIM capacitor, comprising:
   forming a dielectric layer over a substrate;
   forming conductive features in the dielectric layer;
   forming a first dielectric structure on the dielectric layer and the conductive features;
   forming a stacking structure comprising alternately stacked conductive layers and insulating layers on the first dielectric structure;
   shaping the stacking structure to form the MIM capacitor with a ladder structure;
   forming a second dielectric structure to cover the MIM capacitor;
   forming contact vias and conductive lines in the second dielectric structure, wherein the contact vias connect the MIM capacitor to the conductive lines running over the contact vias; and
   forming conductive plugs penetrating through the first and second dielectric structures and electrically connected to the conductive lines, wherein the conductive plugs are laterally spaced apart from the MIM capacitor, and extend from above the MIM capacitor to further below a bottom side of the MIM capacitor.

16. The method of claim 15, wherein each of the conductive plugs is in lateral and vertical contact with one of the conductive lines.

17. The method of claim 15, wherein each of the conductive plugs lands on one of the conductive features formed in the dielectric layer.

18. The method of claim 15, wherein shaping the stacking structure to form the MIM capacitor comprises:
   forming a mask layer on the stacking structure;
   etching the stacking structure by using the mask layer as an etching mask;
   trimming the mask layer to reduce coverage area of the mask layer;
   repeating a sequence of the etching and the following trimming at least once; and
   removing the mask layer, to expose the resulted MIM capacitor.

19. The method of claim 15, wherein the conductive layers in the MIM capacitor are respectively in contact with one of the contact vias.

20. The method of claim 19, wherein each of the conductive lines is connected to a group of the contact vias, and is connected to one of the conductive plugs.

* * * * *